(12) United States Patent
Kobayashi et al.

(10) Patent No.: US 6,772,029 B2
(45) Date of Patent: Aug. 3, 2004

(54) WAFER TRANSFER CONTROL APPARATUS AND METHOD FOR TRANSFERRING WAFER

(75) Inventors: Yoichi Kobayashi, Kanagawa (JP); Yasumasa Hiroo, Kanagawa (JP); Tsuyoshi Ohashi, Kanagawa (JP)

(73) Assignee: Ebara Corporation, Tokyo (JP)

( * ) Notice: Subject to any disclaimer, the term of this patent is extended or adjusted under 35 U.S.C. 154(b) by 138 days.

(21) Appl. No.: 10/181,293

(22) PCT Filed: Dec. 28, 2000

(86) PCT No.: PCT/JP00/09404
§ 371 (c)(1),
(2), (4) Date: Jul. 16, 2002

(87) PCT Pub. No.: WO01/54187
PCT Pub. Date: Jul. 26, 2001

(65) Prior Publication Data
US 2002/0192055 A1 Dec. 19, 2002

(30) Foreign Application Priority Data
Jan. 17, 2000 (JP) .......................... 2000-008038

(51) Int. Cl.[7] .......................... G06F 17/60; H01L 21/68
(52) U.S. Cl. ........................ 700/100; 700/117; 700/121; 414/935; 438/908
(58) Field of Search .............................. 700/28, 90, 95, 700/100, 103, 117, 121; 414/935, 222.01; 438/5, 907, 908

(56) References Cited

U.S. PATENT DOCUMENTS 6,161,969 A * 12/2000 Kimura et al. .............. 396/611
6,418,350 B1 * 7/2002 Hamidzadeh et al. ....... 700/100
6,496,746 B2 * 12/2002 Jevtic .......................... 700/100

FOREIGN PATENT DOCUMENTS

| JP | 7-201950 | 8/1995 |
| JP | 10-256342 | 9/1998 |
| JP | 11-102953 | 4/1999 |
| JP | 2000-332083 | 3/2000 |

* cited by examiner

*Primary Examiner*—Jayprakash N. Gandhi
(74) *Attorney, Agent, or Firm*—Wenderoth, Lind & Ponack, L.L.P.

(57) ABSTRACT

The present invention provides a substrate transfer controlling apparatus which can easily maximize the throughput of a substrate processing apparatus such as a semiconductor fabrication apparatus, and can satisfy a demand for immediacy of actions of a transfer device. The substrate transfer controlling apparatus comprises an input device (12) for inputting times required for actions of transfer devices (1a through 1c) and times required to process substrates in processing devices (3a through 9d), and a schedule calculator (21) for calculating execution times of actions of the transfer devices (1a through 1c) for allowing the time when a final one of the substrates to be processed is fully processed and returned from the substrate processing apparatus to be earliest, based on a predetermined conditional formula including, as parameters, the inputted times. The substrate transfer controlling apparatus further comprises an action commander (24) for instructing the corresponding transfer devices to perform the actions at the calculated execution times of the actions of the transfer devices (1a through 1c).

21 Claims, 20 Drawing Sheets

F I G. 3
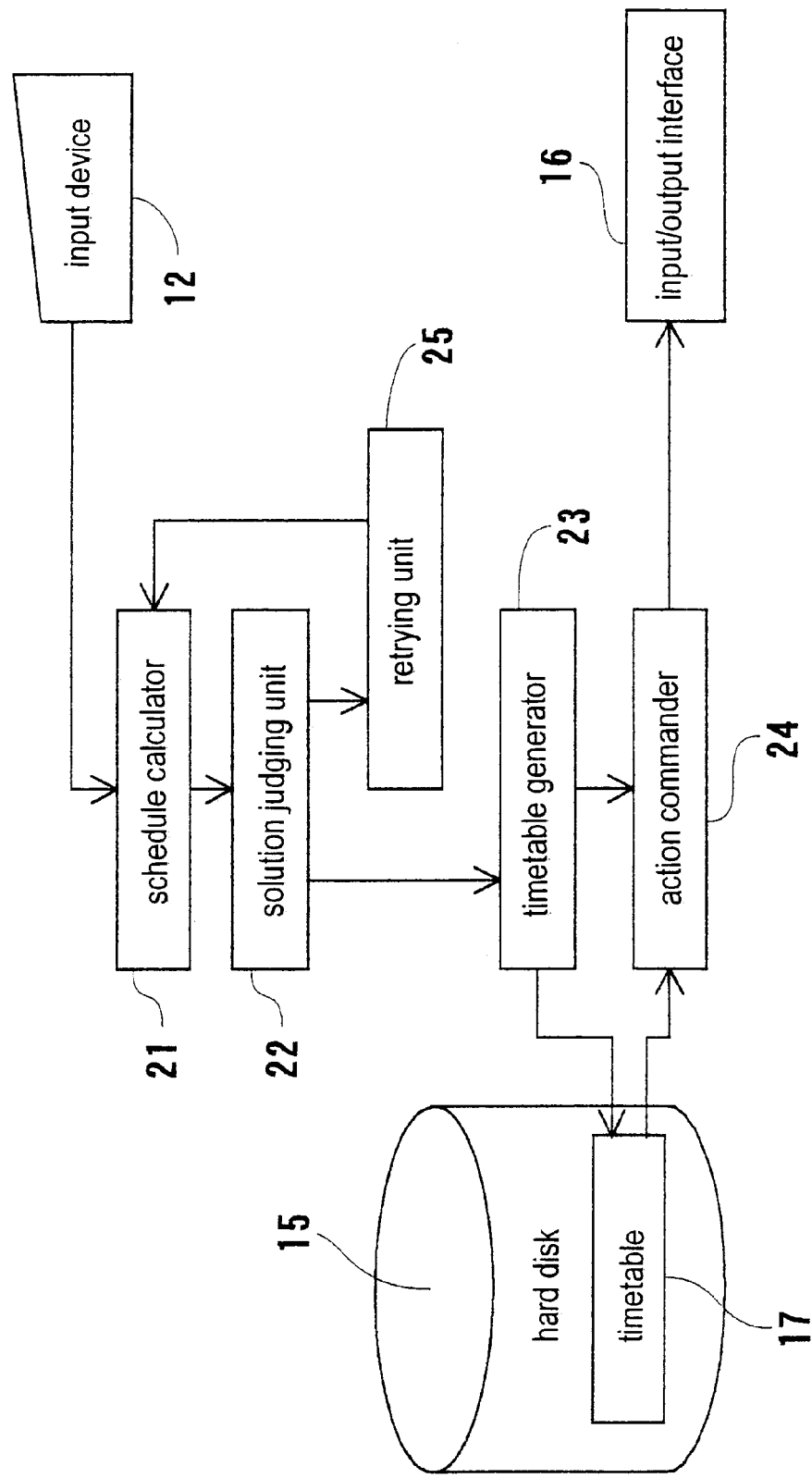

dummy substrates dummy substrates dummy substrate dummy substrate

WAFER TRANSFER CONTROL APPARATUS AND METHOD FOR TRANSFERRING WAFER

TECHNICAL FIELD

The present invention relates to a substrate transfer controlling apparatus and a substrate transferring method, and more particularly to a substrate transfer controlling apparatus and a substrate transferring method for transferring a plurality of substrates in a substrate processing apparatus such as a semiconductor fabrication apparatus, with a transfer device, successively to a plurality of processing devices for processing the substrates therein. The present invention also relates to a substrate processing apparatus in which the transfer of substrates is controlled by such a substrate transfer controlling apparatus.

BACKGROUND ART

There are various types of configurations in semiconductor fabrication apparatus. Generally, there have been used many semiconductor fabrication apparatus which are arranged such that a plurality of semiconductor substrates (wafers) are successively introduced from a cassette, and transferred between a plurality of processing devices by a plurality of transfer devices and processed concurrently thereby, and the substrates that have been processed are returned to the cassette. There have been known other semiconductor fabrication apparatus in which a plurality of cassettes can be mounted and replaced. Such semiconductor fabrication apparatus are continuously operable by replacing a cassette loaded with processed substrates with a cassette loaded with unprocessed substrates. Operation of these semiconductor fabrication apparatus, particularly the transfer devices, is controlled by a substrate transfer controlling apparatus.

A typical control process in a conventional substrate transfer controlling apparatus will briefly be described below.

The conventional substrate transfer controlling apparatus is continuously supplied with the statuses of transfer devices which are being controlled thereby. Based on the supplied statuses of the transfer devices, the substrate transfer controlling apparatus detects any transfer devices that are not in operation, i.e., any inoperative transfer devices. If the substrate transfer controlling apparatus detects any inoperative transfer devices, then it inspects, with respect to each of the inoperative transfer devices, whether there is a processed substrate in a processing device as a transfer source, whether there is an empty arm of the transfer device for receiving a substrate, and whether there is an empty processing device as a transfer destination. Then, the substrate transfer controlling apparatus determines all possible actions. Subsequently, with respect to each of the inoperative transfer devices where possible actions are present, the substrate transfer controlling apparatus determines an action to be performed next, and transmits a command for carrying out the action to the corresponding transfer device. In response to the received command, the inoperative transfer device starts the next action.

Specifically, if the substrate transfer controlling apparatus detects that the transfer device is inoperative at each point of time in the operation of the semiconductor fabrication apparatus, then the substrate transfer controlling apparatus determines whether or not a condition for carrying out a certain action to be done (operable condition) is satisfied. If there are any actions that satisfy the condition, then the substrate transfer controlling apparatus selects an action of highest priority and instructs the transfer device to perform the selected action.

The substrate transfer controlling apparatus repeats the above process to control the transfer of substrates in the semiconductor fabrication apparatus.

With the conventional substrate transfer controlling apparatus, only when the operable condition is satisfied, the inoperative transfer device moves from the present position to the position of a processing device where a substrate is to be delivered or received. Specifically, even when the transfer device is inoperative, since it cannot move before the operable condition is satisfied, the throughput of the semiconductor fabrication apparatus tends to decrease.

One solution is to modify the operable condition as much as possible to allow each transfer device to start moving early by predicting the processing end time in a processing device as a transfer source. Even if the operable condition is thus modified, since next actions are successively determined, when a plurality of substrates are successively processed, the time for the final substrate to be returned to the cassette after it has fully been processed is liable to be later than a logically possible value (earliest time).

Furthermore, from the viewpoint of process, semiconductor fabrication apparatus are generally desired to transfer a substrate which has been processed in a processing device promptly to a next processing device (the immediacy is required for the semiconductor fabrication apparatus). For example, when a substrate is plated, the plated substrate needs to be transferred immediately to a next processing device and post-processed for cleaning or the like because if the plated substrate were left as it is, it would be lowered in quality due to oxidization or the like. Specifically, a certain constraint relative to the time to operate a transfer device (in the above example, a condition that the waiting time of a processed substrate for a transfer device is zero) may be required.

However, in the conventional substrate transfer controlling apparatus, even if an operable condition with respect to an action of high priority is satisfied, the transfer device cannot immediately perform the action as long as the transfer device is in operation. Therefore, the conventional substrate transfer controlling apparatus cannot control the transfer of substrates in consideration of constraints relative to the time to operate a transfer device.

Consequently, it is necessary to conduct an advance simulation prior to operation of the semiconductor fabrication apparatus to confirm whether it is possible to perform a control process satisfying such a constraint. However, such a process is tedious and time-consuming. Alternatively, it is necessary to pose a limitation on an expected processing time for each type of processing device in order to satisfy a constraint relative to the time to operate a transfer device. Further, the demand for immediacy of operation of the transfer device cannot accordingly be met in some cases, thereby leading to a reduction in quality and yield. Alternatively, it is necessary to arrange a post-processing device which requires immediacy and a main processing device integrally with each other, thus resulting in a limitation on the apparatus arrangement.

DISCLOSURE OF INVENTION

The present invention has been made in view of the above conventional problems. It is an object of the present invention to provide a substrate transfer controlling apparatus and a substrate transferring method which can easily maximize the throughput of a substrate processing apparatus such as a semiconductor fabrication apparatus, and can satisfy a demand for immediacy of actions of a transfer device. It is also an object of the present invention to provide a substrate processing apparatus which incorporates such a substrate transfer controlling apparatus.

In order to solve the problems of the conventional substrate transfer controlling apparatus, according to an aspect of the present invention, there is provided a substrate transferring method of transferring substrates with a transfer device between a plurality of processing devices installed in a substrate processing apparatus, the substrate transferring method characterized by comprising: calculating execution times of actions of the transfer device for allowing the time when a final one of the substrates to be processed is fully processed and returned from the substrate processing apparatus to be earliest, based on a predetermined conditional formula including, as parameters, times required for the actions of the transfer device and times required to process the substrates in the processing devices; and instructing the corresponding transfer device to perform the actions at the calculated execution times of the actions of the transfer device.

According to a preferred aspect of the present invention, in the above method, the execution times of the actions of the transfer device are calculated according to a linear programming process.

According to a preferred aspect of the present invention, the substrate transferring method further comprises: determining whether or not a solution of the execution times of the actions of the transfer device is obtained based on the conditional formula; and when it is determined that a solution of the execution times is not obtained, correcting the conditional formula so as to reduce the average number of substrates which are simultaneously present in the substrate processing apparatus, and retrying calculating the execution times based on the corrected conditional formula.

With the above method, since the execution times of actions of the transfer device can be scheduled so that the time when a final one of the substrates to be processed is fully processed and returned from the substrate processing apparatus is made earliest, the throughput of the substrate processing apparatus can be maximized.

The time when a final one of the substrates to be processed is fully processed and returned from the substrate processing apparatus can be made earliest while satisfying constraints set in relation to the action times of the transfer device without the need for an awkward advance review and limitations on expected processing times. Therefore, requirements for the processing of substrates can be met, and the throughput of the substrate processing apparatus can be maximized.

According to a preferred aspect of the present invention, the substrate transferring method further comprises: determining whether or not it is necessary to newly calculate execution times of actions of the transfer device after the substrate processing apparatus has started to operate; when it is determined that it is necessary to newly calculate execution times of actions of the transfer device, determining an assumed time and a final substrate to be processed in calculating the execution times; and while holding the result of a past scheduling process prior to the determined assumed time, calculating new execution times of actions for substrates up to the determined final substrate.

With the above method, even in a situation where the expected processing times of substrates while the substrate processing apparatus is in continuous operation can sequentially be obtained in divided forms, the throughput can approximately be maximized while satisfying limitations on the processing of substrates.

Because the number of additional substrates to be scheduled can be presumed in view of a calculable number of substrates in each scheduling attempt, a computer of relatively low processing capability can perform a scheduling process.

According to a preferred aspect of the present invention, the substrate transferring method further comprises: acquiring times when the transfer device start the actions thereof; determining whether or not the acquired times and the execution times in the result of the past scheduling process are inconsistent with each other or differ from each other by at least a predetermined range; and when it is determined that the acquired times and the execution times in the result of the past scheduling process are inconsistent with each other or differ from each other by at least the predetermined range, correcting the execution times of the actions of the transfer device which are not performed at that time.

With the above method, even if actions of a transfer device or the processing of substrates in processing devices is delayed behind expected times, it is possible to minimize any effects of the delay on limitations on the processing of substrates and the throughput, and the substrate processing apparatus can be operated without allowing such effects to remain in the future.

According to a preferred aspect of the present invention, the substrate transferring method further comprises: detecting a change in conditions with respect to a substrate expected to be introduced into the substrate processing apparatus after the substrate processing apparatus has started to operate; and when a change in conditions with respect to the substrate is detected, correcting the execution times of the actions of the transfer device on the substrate for which a condition is changed and substrates subsequent to the substrate for which a condition is changed.

With the above method, even if there is a change in conditions with respect to an unintroduced substrate, e.g., a cancellation of the processing of the substrate, a change in the expected processing time of the substrate, or a change in the sequence of introduction of the substrate into the substrate processing apparatus, the substrate processing apparatus can be operated flexibly based on the change in the conditions.

According to a preferred aspect of the present invention, in the above method, when the process of at least one processing device in the substrate processing apparatus with respect to at least one substrate is omitted, the execution times of the actions of the transfer device are calculated so as to transfer the at least one substrate to skip the at least one processing device.

With the above method, since a substrate can be transferred to skip an unwanted processing device type or types while the substrate processing apparatus is being continuously operated, a plurality of processing device types can selectively be used depending on the purpose of processes performed thereby. Therefore, the throughput of the substrate processing apparatus can greatly be increased, and the substrate processing apparatus can be operated flexibly for multi-product small-lot production.

According to another aspect of the present invention, there is provided a substrate transfer controlling apparatus for controlling transfer of substrates with a transfer device between a plurality of processing devices installed in a substrate processing apparatus, the substrate transfer controlling apparatus characterized by comprising: an input device for inputting times required for actions of the transfer device and times required to process substrates in the processing devices; a schedule calculator for calculating execution times of actions of the transfer device for allowing the time when a final one of the substrates to be processed is fully processed and returned from the substrate processing apparatus to be earliest, based on a predetermined conditional formula including, as parameters, the times inputted with the input device; and an action commander for instructing the corresponding transfer device to perform the actions at the execution times of the actions of the transfer device which are calculated by the schedule calculator.

According to a preferred aspect of the present invention, in the above apparatus, the schedule calculator calculates the execution times of the actions of the transfer device according to a linear programming process.

According to a preferred aspect of the present invention, the substrate transfer controlling apparatus further comprises: a solution judging unit for determining whether or not a solution of the execution times of the actions of the transfer device is obtained by the schedule calculator; and a retrying unit for, when it is determined by the solution judging unit that a solution of the execution times is not obtained, correcting the conditional formula so as to reduce the average number of substrates which are simultaneously present in the substrate processing apparatus, and retrying calculating the execution times by the schedule calculator.

According to a preferred aspect of the present invention, the substrate transfer controlling apparatus further comprises: a schedule judging unit for determining whether or not it is necessary to newly calculate execution times of actions of the transfer device by the schedule calculator after the substrate processing apparatus has started to operate; and a calculating condition determiner for, when it is determined by the schedule judging unit that it is necessary to newly calculate execution times of actions of the transfer device, determining an assumed time and a final substrate to be processed in calculating the execution times by the schedule calculator; wherein the schedule calculator calculates new execution times of actions for substrates up to the final substrate determined by the calculating condition determiner while holding the result of a past scheduling process prior to the assumed time determined by the calculating condition determiner.

According to a preferred aspect of the present invention, the substrate transfer controlling apparatus further comprises: an actual time acquisition unit for acquiring times when the transfer device start the actions thereof; a rescheduling judging unit for determining whether or not the times acquired by the actual time acquisition unit and the execution times in the result of the past scheduling process are inconsistent with each other or differ from each other by at least a predetermined range; and a corrector for, when it is determined by the rescheduling judging unit that the acquired times and the execution times in the result of the past scheduling process are inconsistent with each other or differ from each other by at least the predetermined range, correcting the execution times of the actions of the transfer device which are not performed at that time.

According to a preferred aspect of the present invention, the substrate transfer controlling apparatus further comprises: a condition change detector for detecting a change in conditions with respect to a substrate expected to be introduced into the substrate processing apparatus after the substrate processing apparatus has started to operate; and a corrector for, when a change in conditions with respect to the substrate is detected by the condition change detector, correcting the execution times of the actions of the transfer device on the substrate for which a condition is changed and substrates subsequent to the substrate for which a condition is changed.

According to a preferred aspect of the present invention, in the above apparatus, when the process of at least one processing device in the substrate processing apparatus with respect to at least one substrate is omitted, the schedule calculator calculates the execution times of the actions of the transfer device so as to transfer the at least one substrate to skip the at least one processing device.

According to still another aspect of the present invention, there is provided a substrate processing apparatus having a plurality of processing devices for processing substrates while transferring the substrates with a transfer device between the processing devices, the substrate processing apparatus characterized by comprising the above substrate transfer controlling apparatus.

BRIEF DESCRIPTION OF DRAWINGS

FIG. 3 is a block diagram showing a configuration of the substrate transfer controlling apparatus according to the first embodiment of the present invention;

BEST MODE FOR CARRYING OUT THE INVENTION

A substrate transfer controlling apparatus according to a first embodiment of the present invention will be described below with reference to FIGS. 1 through 4. The substrate transfer controlling apparatus according to the present invention serves to control the transfer of substrates between a plurality of processing devices installed in a substrate processing apparatus. The substrate processing apparatus in which the transfer of substrates is controlled by the substrate transfer controlling apparatus will hereinafter be described as a semiconductor fabrication apparatus for processing semiconductor substrates (wafers). However, the present invention is not limited to the semiconductor fabrication apparatus, but is also applicable to a substrate processing apparatus for processing glass substrates for LCD fabrication, for example.

Figure 1:
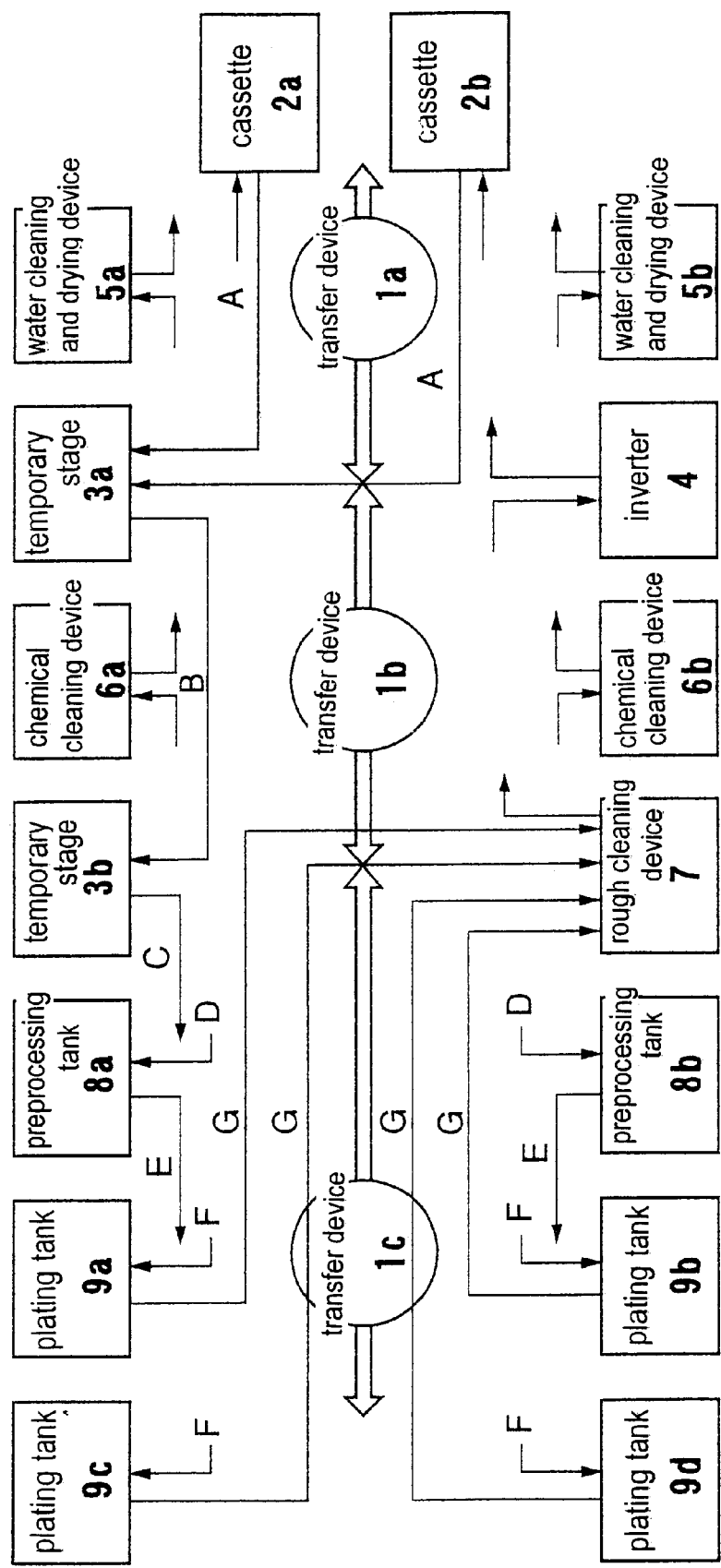
FIG. 1 is a schematic diagram showing an arrangement of a semiconductor fabrication apparatus according to an embodiment of the present invention.

FIG. 1 is a schematic diagram showing an arrangement of a semiconductor fabrication apparatus according to the present embodiment. As shown in FIG. 1, the semiconductor fabrication apparatus which is controlled by the substrate transfer controlling apparatus according to the present invention comprises transfer devices 1a through 1c for transferring substrates, cassettes 2a, 2b which are loaded with substrates, temporary stages 3a, 3b for use in receiving and delivering substrates, an inverter 4, water cleaning and drying devices 5a, 5b, chemical cleaning devices 6a, 6b, a rough cleaning device 7, preprocessing tanks 8a, 8b, and plating tanks 9a through 9d. In the present embodiment, not only the processing components 5a through 9d, but also the temporary stages 3a, 3b and the inverter 4 are handled as processing devices. The semiconductor fabrication apparatus may be arranged as any of various apparatus such as a CVD apparatus for performing film deposition and a polishing apparatus for polishing substrates, and the processing devices may comprise various devices in accordance with the semiconductor fabrication apparatus.

A substrate loaded in the cassette 2a or 2b is introduced into the semiconductor fabrication apparatus by the transfer device 1a, transferred to the temporary stage 3a by the transfer device 1a, and further transferred to the temporary stage 3b by the transfer device 1b. Then, the substrate is transferred to the preprocessing tank 8a or 8b by the transfer device 1c, processed therein, and then reversed. Thereafter, the substrate is transferred to the plating tanks 9a through 9d by the transfer device 1c, processed therein, and further transferred to the rough cleaning device 7. After being roughly cleaned, the substrate is transferred to the chemical cleaning device 6a or 6b by the transfer device 1b, processed thereby, further transferred to the inverter 4, and reversed thereby. The substrate is finally transferred to the water cleaning and drying device 5a or 5b by the transfer device 1a, processed thereby, and returned to the cassette 2a or 2b which was initially loaded with the substrate. Not only a single substrate may be processed at a time, but also a set of a plurality of substrates held together which are interconnected by a jig, for example, may be processed at a time.

In the present embodiment, the actions of the transfer devices 1a through 1c are predefined. For example, predefined actions of the transfer device 1c include an action C for moving to the temporary stage 3b and receiving a substrate therefrom, an action D for transferring a substrate to the preprocessing tanks 8a, 8b and delivering the substrate thereto, an action E for moving to the preprocessing tanks 8a, 8b and receiving a preprocessed substrate therefrom, an action F for transferring a substrate to the plating tanks 9a through 9d and delivering the substrate thereto, and an action G for moving to the plating tanks 9a through 9d, receiving a plated substrate therefrom, moving to the rough cleaning device, and delivering the substrate thereto.

Figure 2:
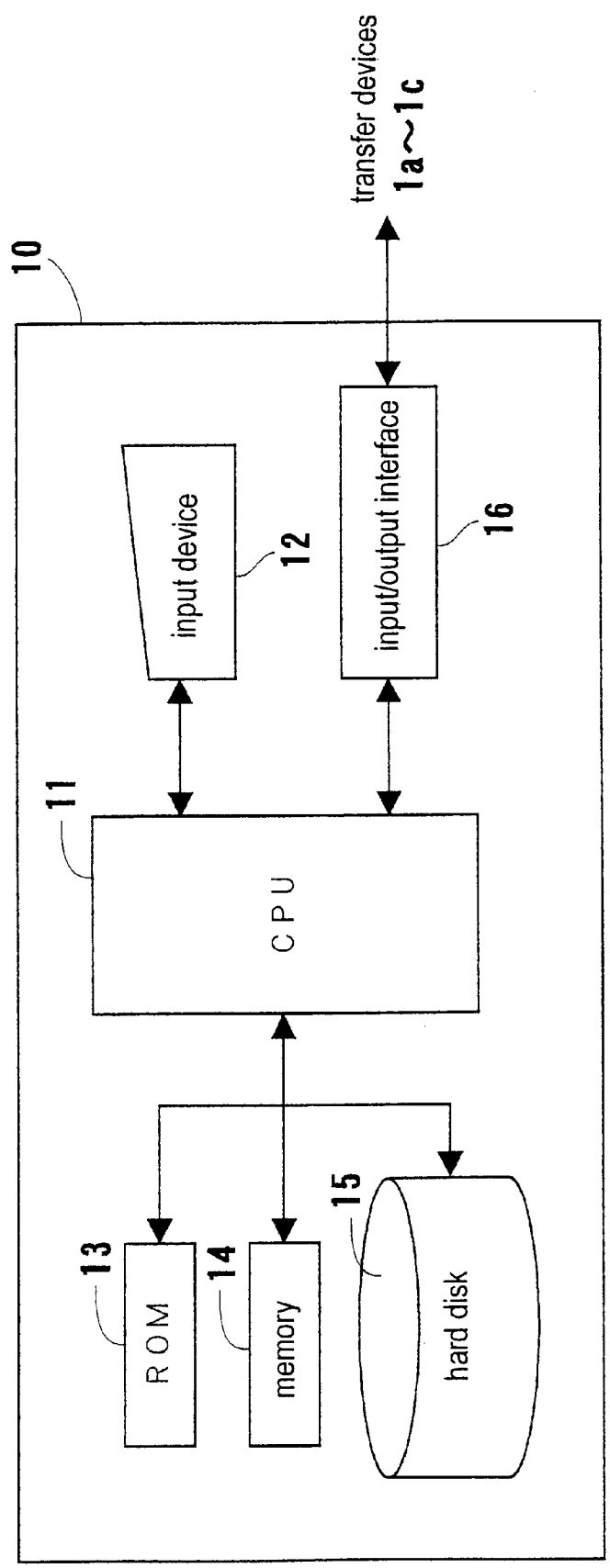
FIG. 2 is a diagram showing an example of a hardware configuration of the substrate transfer controlling apparatus according to a first embodiment of the present invention.

The substrate transfer controlling apparatus in the present embodiment will be described below. FIG. 2 is a diagram showing an example of a hardware configuration of the substrate transfer controlling apparatus according to the present embodiment, and FIG. 3 is a block diagram showing a configuration of the substrate transfer controlling apparatus according to the present embodiment.

As shown in FIG. 2, the substrate transfer controlling apparatus 10 comprises a central processing unit (CPU) 11, an input device 12 such as a pointing device including a keyboard, a mouse, and the like, and a communication device for reading data stored in other computers, and storage devices including a ROM 13, a memory 14, and a hard disk 15. The substrate transfer controlling apparatus 10 is connected to the transfer devices 1a through 1c of the semiconductor fabrication apparatus via an input/output interface 16. Signals from the CPU 11 are transmitted through the input/output interface 16 to the transfer devices 1a through 1c of the semiconductor fabrication apparatus for thereby controlling the transfer devices 1a through 1c.

The ROM 13 and the hard disk 15 store the codes of a computer program for issuing commands to the CPU 11 or the like in cooperation with an operating system (OS) to control the transfer of substrates. The computer program is loaded into the memory 14 and executed in cooperation with the CPU 11 for performing the following substrate transfer controlling process. The computer program in cooperation with the CPU 11 provides, as shown in FIG. 3, a schedule calculator 21, a solution judging unit 22, a timetable generator 23, an action commander 24, and a retrying unit 25. The hard disk 15 (or the memory 14) stores a timetable 17 generated (updated) by the timetable generator 23 described later.

Figure 4:
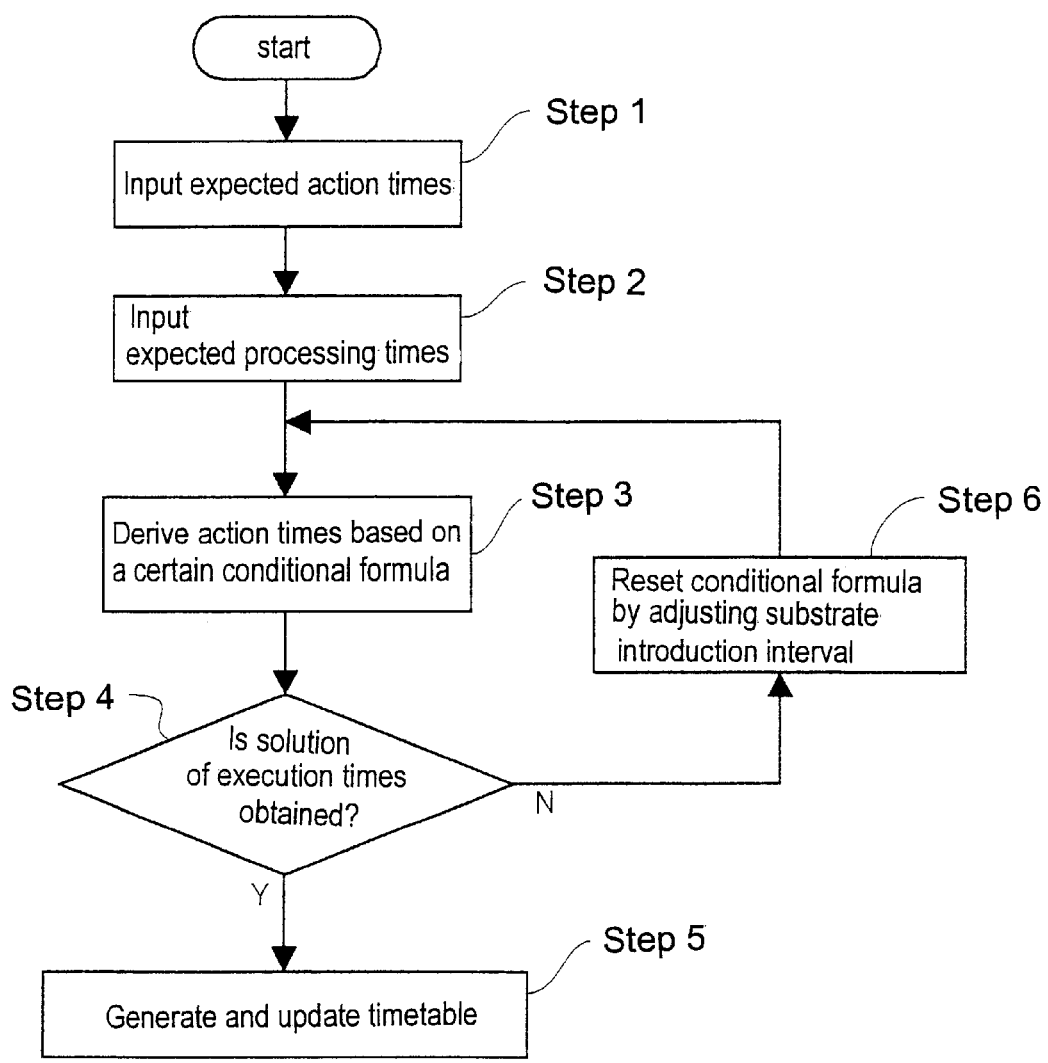
FIG. 4 is a flowchart showing a substrate transfer controlling process according to the first embodiment of the present invention.

A substrate transfer controlling process performed by the substrate transfer controlling apparatus 10 will be described below. FIG. 4 is a flowchart showing the substrate transfer controlling process performed by the substrate transfer controlling apparatus 10 according to the present embodiment.

Before the substrate processing apparatus starts to operate, times required for actions of the transfer devices 1a through 1c in the semiconductor fabrication apparatus (hereinafter referred to as "expected action times") are inputted (Step 1). For example, an expected time required for the transfer devices 1a through 1c to receive substrates from processing devices, and an expected time required for the transfer devices 1a through 1c to move from a processing device to another processing device are inputted. The expected action times are inputted with the input device 12.

Times required for processing substrates in the processing devices 3a through 9d (hereinafter referred to as "expected processing times") are inputted (Step 2). For example, an expected time required to clean a substrate in the rough cleaning device 7 is inputted. The expected processing times are also inputted with the input device 12.

The input device for inputting the expected action times and the expected processing times is not limited to a keyboard, a pointing device, and the like. For example, the expected action times and the expected processing times may be prestored as a file in the storage device 14 or 15, and may then be inputted by reading the file. Alternatively, such a file may be saved in another computer, and the expected action times and the expected processing times may be inputted by reading the file through a communication device. For storing expected action times as a file, times actually required for the actions of transfer devices may be measured by a computer connected to the transfer devices, and may be stored as expected action times in a file. In this case, by measuring times required for the actions of transfer devices while the apparatus is being in operation, performing averaging or the like, and then updating the expected action times stored in the file, the accuracy of expected action times can be increased, and the apparatus can cope with time-dependent changes thereof.

Next, the schedule calculator 21 derives action times of the actions of the transfer devices 1a through 1c (hereinafter referred to as "execution times") for allowing the time when a final one of the substrates to be processed is fully processed and returned from the semiconductor fabrication apparatus to be earliest (Step 3). The schedule calculator 21 derives execution times by calculating a solution satisfying a certain conditional formula, and the details of this process will be described later.

A solution satisfying the above certain conditional formula may not necessarily be derived. After calculations carried out by the schedule calculator 21, the solution judging unit 22 determines whether or not a solution satisfying the above certain conditional formula has been obtained (Step 4).

If the solution judging unit 22 determines that a solution satisfying the above certain conditional formula has been obtained, then the timetable generator 23 generates (updates) a timetable 17 based on the execution times, i.e., a timetable in which the obtained execution times are associated with the actions of the transfer devices that are to be performed at the execution times, and stores the timetable 17 in the hard disk 15 (Step 5).

When the semiconductor fabrication apparatus is in operation, the action commander 24 controls the transfer devices 1a through 1c by referring to the timetable 17 stored in the hard disk 15. Specifically, the action commander 24 transmits a command for an action of the corresponding transfer device through the input/output interface 16 to the transfer device at an execution time described in the timetable 17. As a result, the time when a final one of the substrates to be processed is fully processed and returned from the semiconductor fabrication apparatus is made earliest. Before the action commander 24 transmits a command for an action of each of the transfer devices 1a through 1c, the action commander 24 confirms that the transfer device is inoperative, and that the processing of a substrate in the processing device as a transfer source is completed, and that no preceding substrate is present in the processing device as a transfer destination and the resetting of the processing device is completed. If these conditions are not satisfied, then the action commander 24 waits until the conditions are satisfied and thereafter transmits a command.

If the solution judging unit 22 determines that a solution satisfying the above certain conditional formula has not been obtained, then the retrying unit 25 corrects the conditional formula so as to reduce the average number of substrates which are simultaneously present on the transfer devices and the processing devices in the apparatus, i.e., by adjusting intervals at which substrates are introduced, and retries the processes from Step 3 (Step 6). The conditional formula is corrected by inserting a virtual substrate (hereinafter referred to as "dummy substrate") for which the expected action times of the transfer devices and the expected processing times of the processing devices are zero, at a suitable interval between substrates. At this time, if the number of the substrates that are simultaneously present in the apparatus is reduced, then the frequency of the actions of the transfer devices is reduced and hence the transfer devices can be operated more freely, so that the probability that a solution will be obtained is increased. If no solution is obtained even after the retrying unit 25 retries the process, then the conditional formula is further corrected to reduce the number of the substrates which are simultaneously present in the apparatus. In extreme cases, after a preceding substrate is fully processed and returned to the cassette 2a or 2b, a next substrate is introduced into the apparatus.

Next, the setting of a conditional formula and the deriving of the execution times in the schedule calculator 21 will be described below with a specific example. The setting of a conditional formula and the deriving of the execution times which will be described below are examples thereof, and can be performed according to any of all other processes.

First, the numbers (action numbers) k of actions of the transfer devices 1a through 1c are defined successively as 1, 2, 3, ..., K along a path from the introduction of a substrate into the semiconductor fabrication apparatus to the return of the substrate from the semiconductor fabrication apparatus. It is assumed that a sufficient time has elapsed from the start of operation of the semiconductor fabrication apparatus and the semiconductor fabrication apparatus is in steady operation with a sufficient number of substrates present therein, and the number of a next action to be executed by a transfer device performing an action k is represented by kp(k). It is also assumed that a suitable number of dummy substrates are present before the first substrate at the start of operation of the semiconductor fabrication apparatus and after the final substrate at the end of operation of the semiconductor fabrication apparatus, with the substrate number n being determined in the order in which substrates including the dummy substrates are introduced from the cassette 2a or 2b into the semiconductor fabrication apparatus, and an increment in the substrate number of substrates to be handled when the action k changes to the next action kp(k) is represented by np(k). For example, with regard to the semiconductor fabrication apparatus shown in FIG. 1, the actions are defined as follows:

An action A of the transfer device 1a to transfer a substrate loaded in the cassette 2a or 2b to the temporary stage 3a is defined as k=1, an action B of the transfer device 1b to transfer a substrate on the temporary stage 3a to the other temporary stage 3b is defined as k=2, the action C of the transfer device 1c to move to the temporary stage 3b and receive a substrate therefrom is defined as k=3, the action D of the transfer device 1c to transfer the received substrate to the preprocessing tank 8a or 8b and deliver the substrate thereto is defined as k=4, the action E of the transfer device 1c to move to the preprocessing tank 8a or 8b and receive the substrate therefrom is defined as k=5, the action F of the transfer device 1c to transfer the received substrate to the plating tanks 9a through 9d and deliver the substrate thereto is defined as k=6, and the action G of the transfer device 1c to move to the plating tanks 9a through 9d, receive a plated substrate therefrom, move to the rough cleaning device 7, and deliver the substrate thereto is defined as k=7.

On the assumption that a sufficient time has elapsed from the start of operation of the semiconductor fabrication apparatus and the semiconductor fabrication apparatus is in steady operation with a sufficient number of substrates present therein, a sequence of actions of the transfer devices is determined. For example, a sequence of actions of the transfer device 1c is defined as a periodic sequence of 3→5→4→6→7→3→ . . . in terms of the action numbers. In this example, next actions are represented as follows:

kp(3)=5
kp(4)=6
kp(5)=4
kp(6)=7
kp(7)=3

The increments np in the substrate number when the action k changes to the next action kp(k) are defined as shown below. The increments np are determined in view of the number of each type of the processing devices 3a through 9d.

np(3)=−2
np(4)=−2
np(5)=+2
np(6)=−3
np(7)=+6

If each of substrates is assigned periodically in an introduced sequence to the processing devices of the same type (e.g., 8a and 8b, 9a through 9d), then expected action times are uniquely determined as shown below. These expected action times are inputted with the input device 12 or calculated in view of the positions and paths of the transfer devices based on the inputted values.

M1(k, n): Time for a transfer device to move prior to receiving a substrate n from a position immediately before an action k G1(k, n): Time for a transfer device to receive a substrate n from a processing device in an action k M(k, n): Time for a transfer device to hold a substrate n and move in an action k G2(k, n): Time for a transfer device to deliver a substrate n to a processing device in action k M2(k, n): Time for a transfer device to move after delivering a substrate n in the action k These expected action times may occasionally be zero.

The sum of the above expected action times is defined as Tg(k, n). Specifically, $$Tg(k,n)=M1(k,n)+G1(k,n)+M(k,n)+G2(k,n)+M2(k,n)$$

The following non-negative variables are defined:

xr(k, n): Quiescent time of a transfer device immediately before an action k on a substrate n xw(k, n): Waiting time of a transfer device on a processing device immediately before an action k on a substrate n xf(k, n): Idle time of a processing device immediately before a substrate is delivered to the processing device by an action k on a substrate n The waiting time xw(k, n) is defined only with respect to actions including the reception of the substrate from the processing device. The idle time xf(k, n) is defined only with respect to actions including the delivery of the substrate to the processing device. Practically, however, the idle time xf(k, n) may be limited to actions to deliver the substrate to a relay-type processing device which is used to receive and deliver substrates between transfer devices.

If the time to start an action k on a substrate n is represented by t(k, n), then the following three equations are established.

$$t(kp(k),n+np(k))=t(k,n)+Tg(k,n)+xr(kp(k),n+np(k)) \quad (1)$$

$$t(k+1,n)=t(k,n)+Tg(k,n)-M2(k,n)+P(k,n)-M1(k+1,n)+xw(k+1,n) \quad (2)$$

$$t(k,n)=t(k+1,n-U(k))+M1(k+1,n-U(k))+G1(k+1,n-U(k))-M1(k,n)-G1(k,n)-M(k,n)+xf(k,n) \quad (3)$$

P(k, n) in the equation (2) represents an expected processing time of the substrate number n after an action indicated by the action number k, which is either inputted with the input device 12 or calculated based on inputted values. The expected processing time P(k, n) includes, in addition to a time for plating, cleaning, or the like, which is normally specified for each of substrates, a time required for pre-actions such as shutter closing and liquid filling performed before the substrate is processed by the processing device, and a time required for post-actions such as liquid removal and shutter opening performed after the substrate is processed by the processing device. U(k) in the equation (3) represents the number of processing devices of one type to which the substrate is delivered by the action k.

The equation (1) represents a time to start an action to be carried out by the same transfer device next after the action k on the substrate n. The equation (2) represents a time to start an action k+1 to be carried out next after the substrate n is processed by the processing device. The equation (3) represents a time to start an action of the transfer device to deliver the next substrate n after having received the processed substrate from the processing device.

The equations (1) through (3) can be modified as follows:

$$T=RmXr+Rv \quad (1a)$$

$$Xw=WmXr+Wv \quad (2a)$$

$$Xf=FmXr+Fv \quad (3a)$$

where T, Xr, Xw, Xf represent column vectors having t(k, n), xr(k, n), xw(k, n), xf(k, n) as respective elements, and Rm, Wm, Fm represent suitable matrixes, and Rv, Wv, Fv represent suitable column vectors.

The vector T on the left side of the equation (1a) contains an element corresponding to t(K, N) which represents a time to start an action to return the final substrate N (except for a dummy substrate). If a corresponding element in the vector Rm Xr on the right side of the equation (1a) is minimum, then the time when the final substrate to be processed is fully processed and returned from the semiconductor fabrication apparatus is made earliest.

The condition for allowing the time for returning substrates to be earliest can be expressed as follows:

$$cXr \to \text{minimum} \quad (4)$$

where c represents a suitable row vector.

The conditions under which the transfer actions represented by the above equations (1a) through (3a) are physically established are normally indicated by $Xr \geq 0$, $Xw \geq 0$, $Xf \geq 0$. From these inequalities and the above equations (1a) through (3a), there can be derived the following inequalities:

$$Xr \geq 0 \quad (1b)$$

$$WmXr \geq -Wv \quad (2b)$$

$$FmXr \geq -Fv \quad (3b)$$

If a certain time is required from the reception of a preceding substrate from a processing device by a transfer device until the delivery of a next substrate to the processing device by a transfer device, then the required time is added to the corresponding element on the right side of the inequality (3b). For example, after the transfer device 1a receives a reversed substrate from the inverter 4, the transfer device 1b can deliver a next substrate to the inverter 4 only when the reversing mechanism of the inverter 4 is reset. In this case, a time required to reset the reversing mechanism is added to the corresponding element on the right side of the inequality (3b).

As indicated by the equation (1a), since all the times to start actions are expressed by a linear expression of Xr, a linear constraint in relation to an arbitrary action time can be expressed by a linear inequality relative to Xr. For example, if the constraint is such that a substrate immediately after it has been processed is immediately received by an action k0, i.e., if xw(k0, n)=0, then the row corresponding to k0 in the equation (2a) is taken out and can be expressed by the following linear inequality.

$$-Wm0Xr0 \geq Wv0 \quad (5)$$

If a constraint is given to provide an upper limit for the time from the reception of a substrate n0 from an immediately prior processing device in an action k0 until the delivery of the substrate n0 to a next processing device in an action k0+1, then an inequality of a similar form can be derived. Similarly, it is possible to give a constraint to provide a lower limit between times to start two actions, for thereby scheduling the transfer devices with a certain time allowance. Furthermore, it is also possible to define a waiting time from the delivery of a substrate n to a processing device in an action k until the start of an actual process on the substrate n as xw(k, n), and formulate it so as to be included in the above variable vector Xr. In this case, the probability satisfying a constraint to provide an upper limit for xw(k+1, n) can be increased.

The inequalities (1b) through (3b) and (5) can be expressed as follows:

$$AXr \geq b \quad (6)$$

where A represents a suitable matrix and b represents a suitable column vector.

Therefore, in order to allow the time to return the final substrate to be earliest, it is necessary to determine a minimum value of the equation (4) under the inequality (6). Such a solution Xr can be obtained as a solution to a problem of a linear programming process. Once the solution Xr is obtained, the execution times of respective actions for allowing the time to return the final substrate to be earliest can be obtained from the equation (1a), and the above timetable can be generated (updated) based on the obtained execution times.

Figure 5:
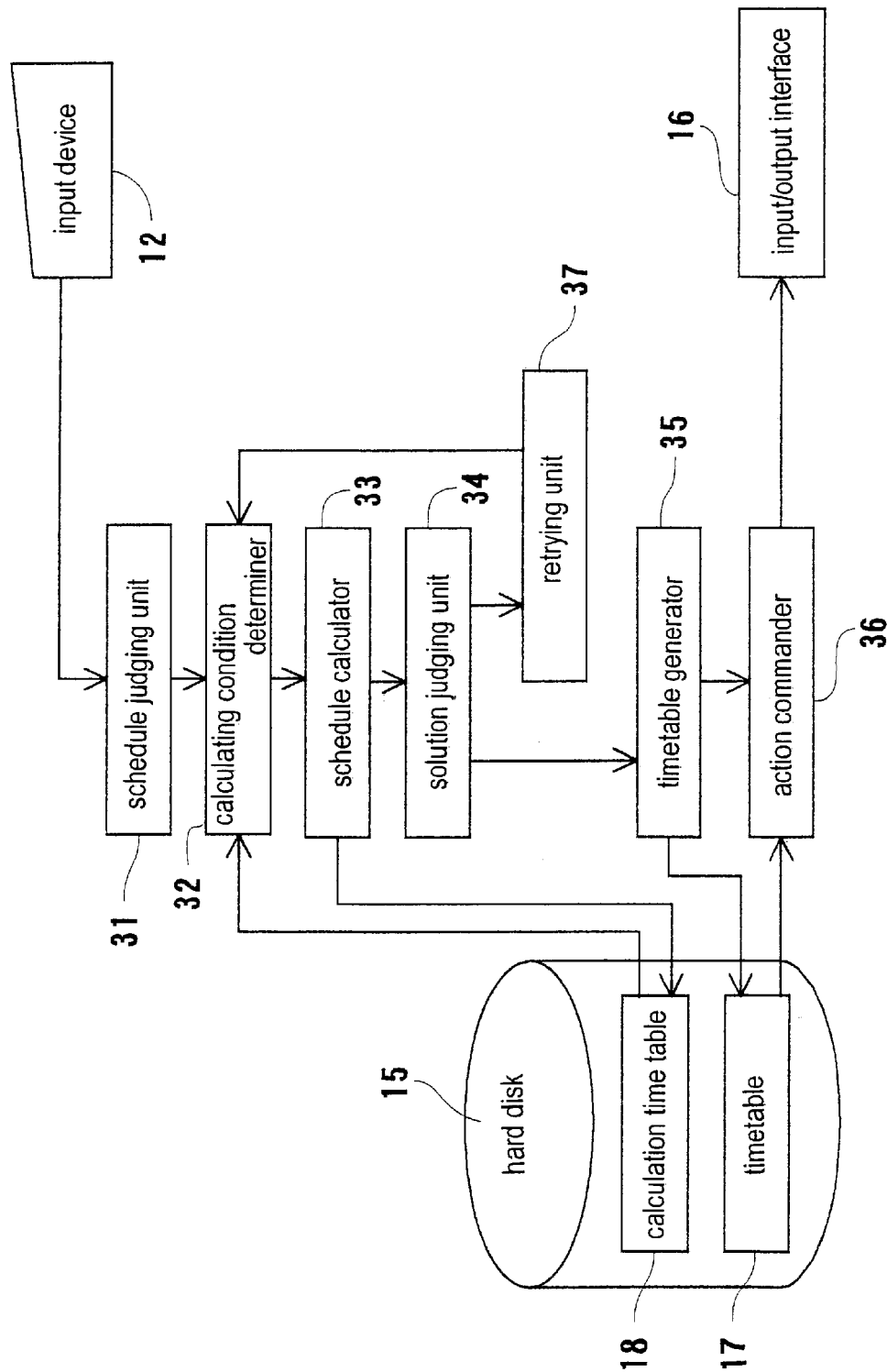
FIG. 5 is a block diagram showing a configuration of a substrate transfer controlling apparatus according to a second embodiment of the present invention.
Figure 6:
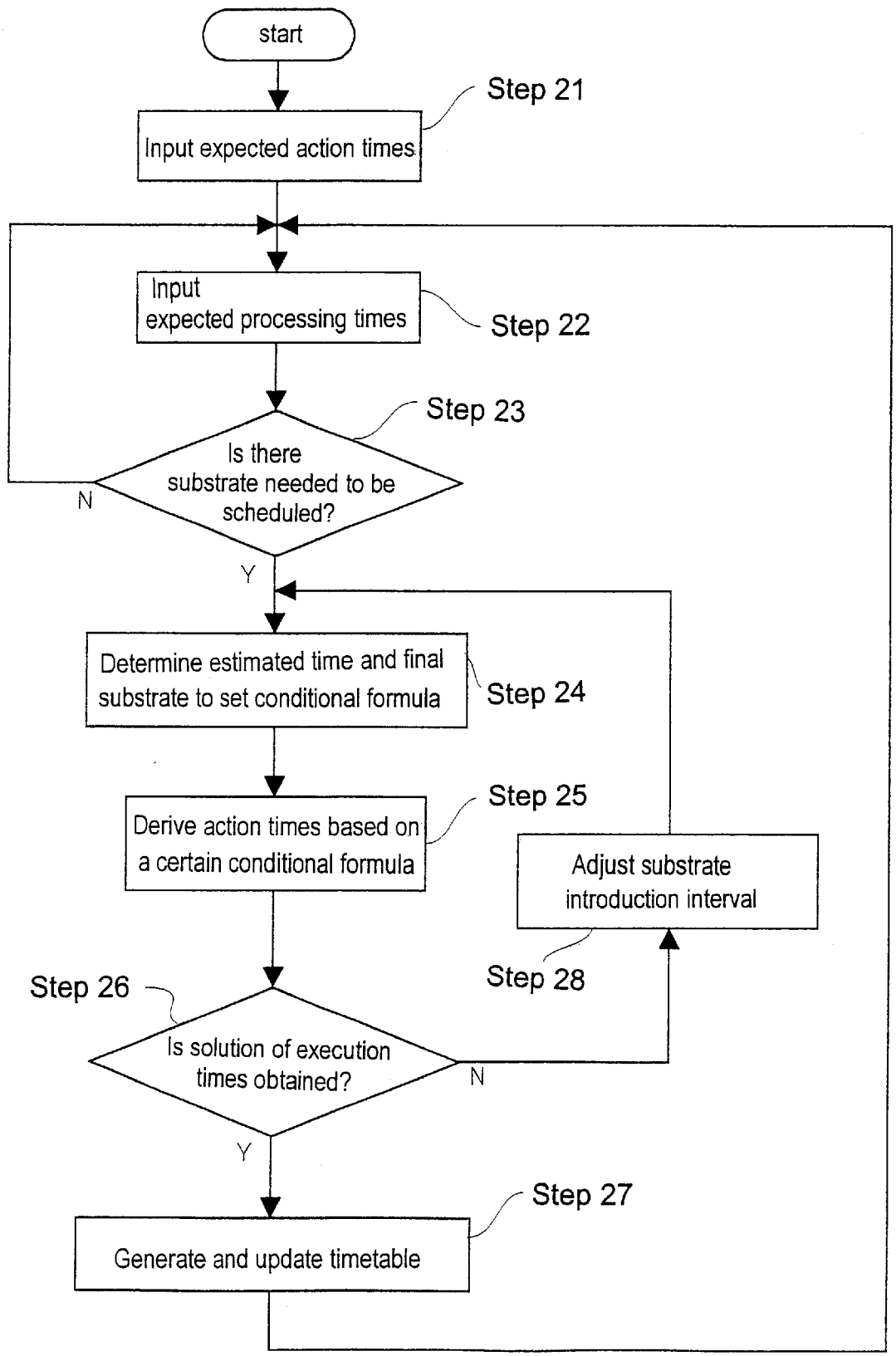
FIG. 6 is a flowchart showing a substrate transfer controlling process according to the second embodiment of the present invention.

A substrate transfer controlling apparatus according to a second embodiment of the present invention will be described below with reference to FIGS. 5 through 7. FIG. 5 is a block diagram showing a configuration of the substrate transfer controlling apparatus 10 according to the present embodiment, FIG. 6 is a flowchart showing a substrate transfer controlling process carried out by the substrate transfer controlling apparatus 10 according to the present embodiment, and FIG. 7 is a diagram showing a visual representation of a time domain to be scheduled according to the present embodiment.

For operating a semiconductor fabrication apparatus continuously for a long period of time, expected processing times for substrates may not necessarily be predetermined, but expected processing times may be determined for unprocessed substrates in a cassette while the semiconductor fabrication apparatus is in operation, e.g., each time a new cassette is loaded, and the transfer of the substrates may be controlled based on those expected processing times. The substrate transfer controlling apparatus according to the second embodiment can cope with such a situation.

Figure 7:
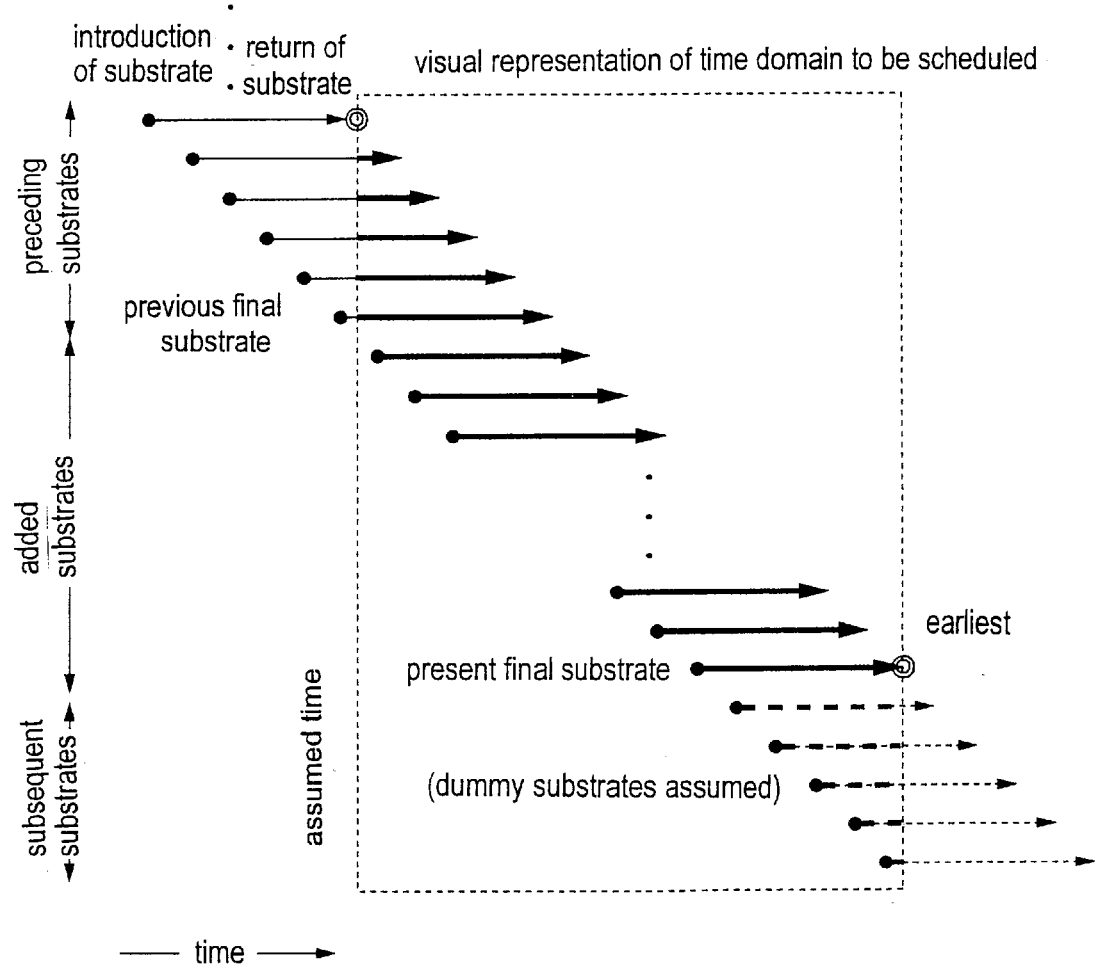
FIG. 7 is a diagram showing a visual representation of a time domain to be scheduled according to the second embodiment of the present invention.

Specifically, the substrate transfer controlling apparatus 10 according to the present embodiment shifts a time domain to be scheduled as shown in FIG. 7 backward during operation of the semiconductor fabrication apparatus, repeats the scheduling successively, and joins the results of respective scheduling events consistently for controlling the transfer of the substrates.

As shown in FIG. 5, the substrate transfer controlling apparatus 10 according to the present embodiment has a calculation time table 18 stored in the hard disk 15. A computer program stored in the storage devices 13 through 15 in cooperation with the CPU 11 provides a schedule judging unit 31, a calculating condition determiner 32, a schedule calculator 33, a solution judging unit 34, a timetable generator 35, an action commander 36, and a retrying unit 37.

A substrate transfer controlling process carried out by the substrate transfer controlling apparatus according to the present embodiment will be described below.

As with the first embodiment, expected action times are inputted with the input device 12 (Step 21), and expected processing times are inputted with the input device 12 (Step 22). In the second embodiment, data inputted with the input device are temporarily stored in the storage device 14 or 15, and then read to enter expected action times and expected processing times.

After the expected action times and the expected processing times are inputted, the schedule judging unit 31 determines whether or not a new scheduling process is required (Step 23), i.e., determines whether there is a substrate that has not scheduled yet even though expected processing times have been inputted.

If the schedule judging unit 31 judges that there is no substrate that has not scheduled yet, i.e., no new scheduling process is required, then the process returns to Step 22 and waits for expected processing times to be inputted.

If the schedule judging unit 31 judges that there is a substrate that has not scheduled yet, then the calculating condition determiner 32 determines an assumed time subsequent to the present time and a final substrate (except for a dummy substrate) to be subject to scheduling calculations (Step 24). The final substrate is a final one of new substrates to be subject to scheduling calculations, which are added to the substrates which have already been scheduled, and is not a dummy substrate.

The assumed time and the final substrate are determined as follows: In the results of a past scheduling process, as shown in FIG. 7, the time when a substrate including a dummy substrate is first returned to the cassette 2a or 2b after a final non-dummy substrate (which is not a dummy substrate) has been introduced into the semiconductor fabrication apparatus is regarded as an assumed time. The number of additional substrates in a range where scheduling calculations therefor can be completed with an allowance from the present time to the assumed time is presumed, and thus a final one of the additional substrates is determined. The number of additional substrates is presumed with the range of substrates which have not been scheduled yet but for which expected processing times have been inputted. If no positive number of additional substrates is obtained, then the assumed time is shifted to the returning time of a next scheduled substrate, and the number of additional substrates is determined. In this manner, the interval from the assumed time to the time at which the final substrate is returned represents an approximate time domain to be scheduled, as shown in FIG. 7.

Here, the average value of times required to perform scheduling calculations on added substrates is saved as the calculation time table 18 in the hard disk 15. The calculating condition determiner 32 estimates a suitable number of added substrates in view of the times required for calculations which are saved in the calculation time table 18.

The time to return the final substrate according to the new scheduling process is usually later than a true earliest value (earliest time) which is achieved when the expected processing times of all substrates are given in advance. If the number of substrates added in each scheduling process is set to a relatively large value, then the time to return the final substrate according to the new scheduling process can be approximated to the true earliest value.

After the calculating condition determiner 32 has determined an assumed time and a final substrate to be subject to scheduling calculations, the schedule calculator 33 derives execution times of the actions of the transfer devices within the above time domain to be scheduled based on the conditional formula after the above additional substrates have been added (Step 25).

A lower limit for substrate numbers to be noticed for each action k is determined by referring to a set of action numbers of which execution times are subsequent to the assumed time and substrate numbers in the results of the past scheduling process. Alternatively, a lower limit for substrate numbers may be determined by determining actions which can happen subsequent to the assumed time due to the order of actions of the transfer devices depending on expected processing times and expected action times. In this manner, the execution times of most actions prior to the assumed time are held, and the execution times of some actions may not be held in the vicinity of the assumed time, in the results of the past scheduling process.

Further, an upper limit for substrate numbers is determined by determining actions which can happen prior to the time to start the returning action of the final substrate to be subject to the above scheduling calculations to the cassette. It is assumed that dummy substrates of which action times and processing times are zero exist subsequent to the final substrate.

Based on the lower limit and the upper limit thus determined for substrate numbers, unknown column vectors T, Xr, and the like are constructed, and scheduling calculations are carried out. In each of scheduling calculations, the average value of times required for scheduling calculations, which has been saved in the calculation time table 18, is updated based on the times that are actually required for the calculations.

When the semiconductor fabrication apparatus starts continuous operation, the immediacy of scheduling is particularly important. Therefore, action times are determined in the order of actions k=1, 2, . . . , K as minimum values satisfying the equations (1) through (3) with respect to the first substrate. If a single substrate is processed in the semiconductor fabrication apparatus, then the action times thus determined allow the time to return the substrate to be earliest. Unless expected processing times and expected action times have extreme values, the substrate is processed by each of the processing devices 3a through 9d and then immediately transferred to the next processing device by the transfer devices 1a through 1c. Thus, an optimum solution satisfying the given constraint is determined.

After the schedule calculator 33 has performed its processing operation, as with the first embodiment, the solution judging unit 34 determines whether or not a solution of execution times has been obtained (Step 26). If a solution of execution times has been obtained, then the timetable generator 35 generates (updates) a timetable (Step 27). After the timetable has been generated (updated), the process returns to Step 22, and the subsequent steps are repeated.

The action commander 36 refers to the timetable 17 stored in the hard disk 15 to control the transfer devices 1a through 1c, as with the first embodiment.

On the other hand, if the solution judging unit 34 judges that a solution of execution times has not been obtained, then the retrying unit 37 inserts a dummy substrate between substrates (Step 28), as with the first embodiment. In this case, the calculating condition determiner 32 determines an assumed time and a final substrate to be subject to scheduling calculations such that a non-dummy additional substrate will exist, also in view of the inserted dummy substrate.

In the present embodiment, since the execution times of actions of the transfer devices which are determined by the new scheduling process may possibly be prior to the assumed time, it is necessary to set a margin of safety to a large value in presuming the number of additional substrates for finishing scheduling calculations earlier than the assumed time to allow the action commander 36 to issue action commands to the transfer devices.

Figure 8:
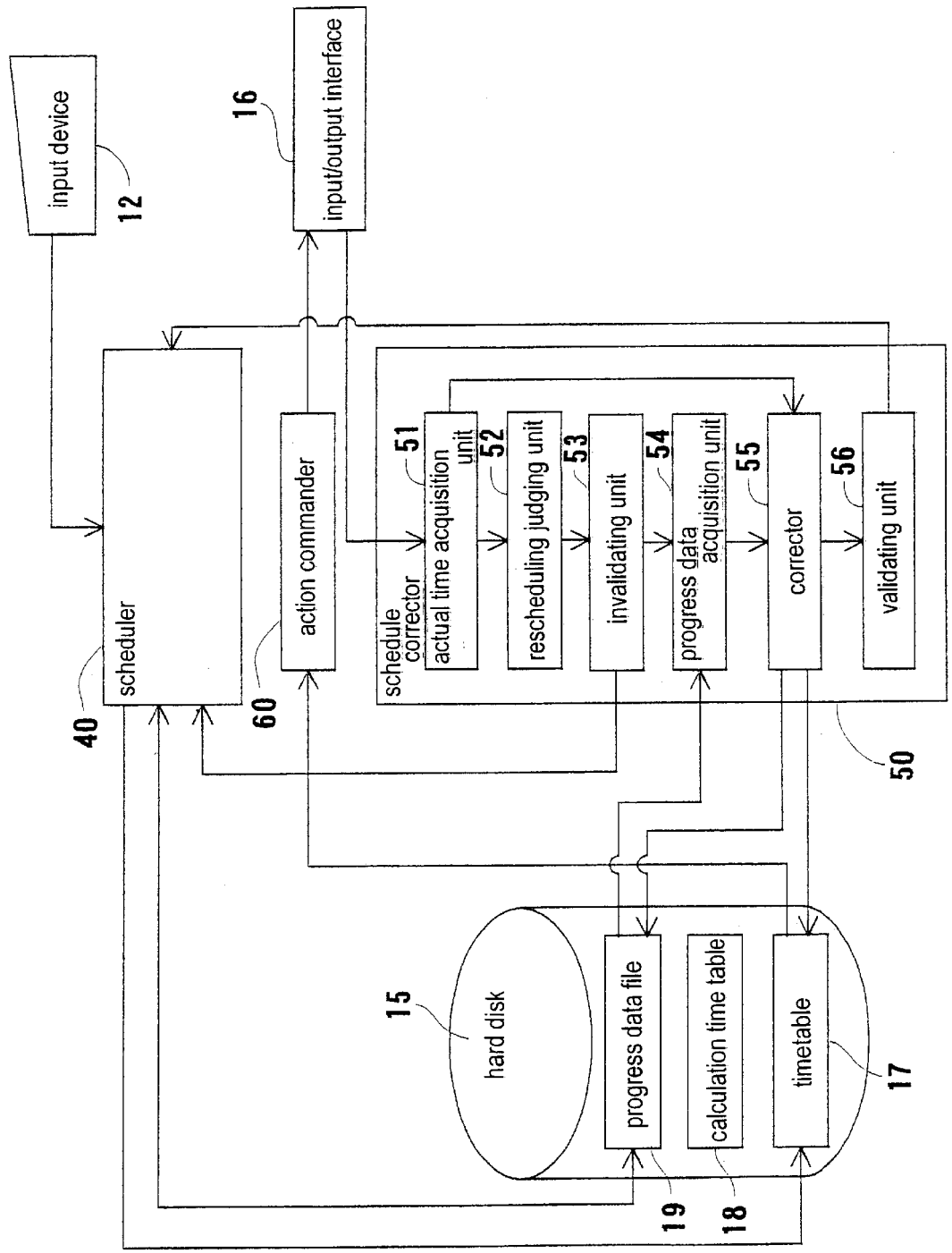
FIG. 8 is a block diagram showing a configuration of a substrate transfer controlling apparatus according to a third embodiment of the present invention.
Figure 9:
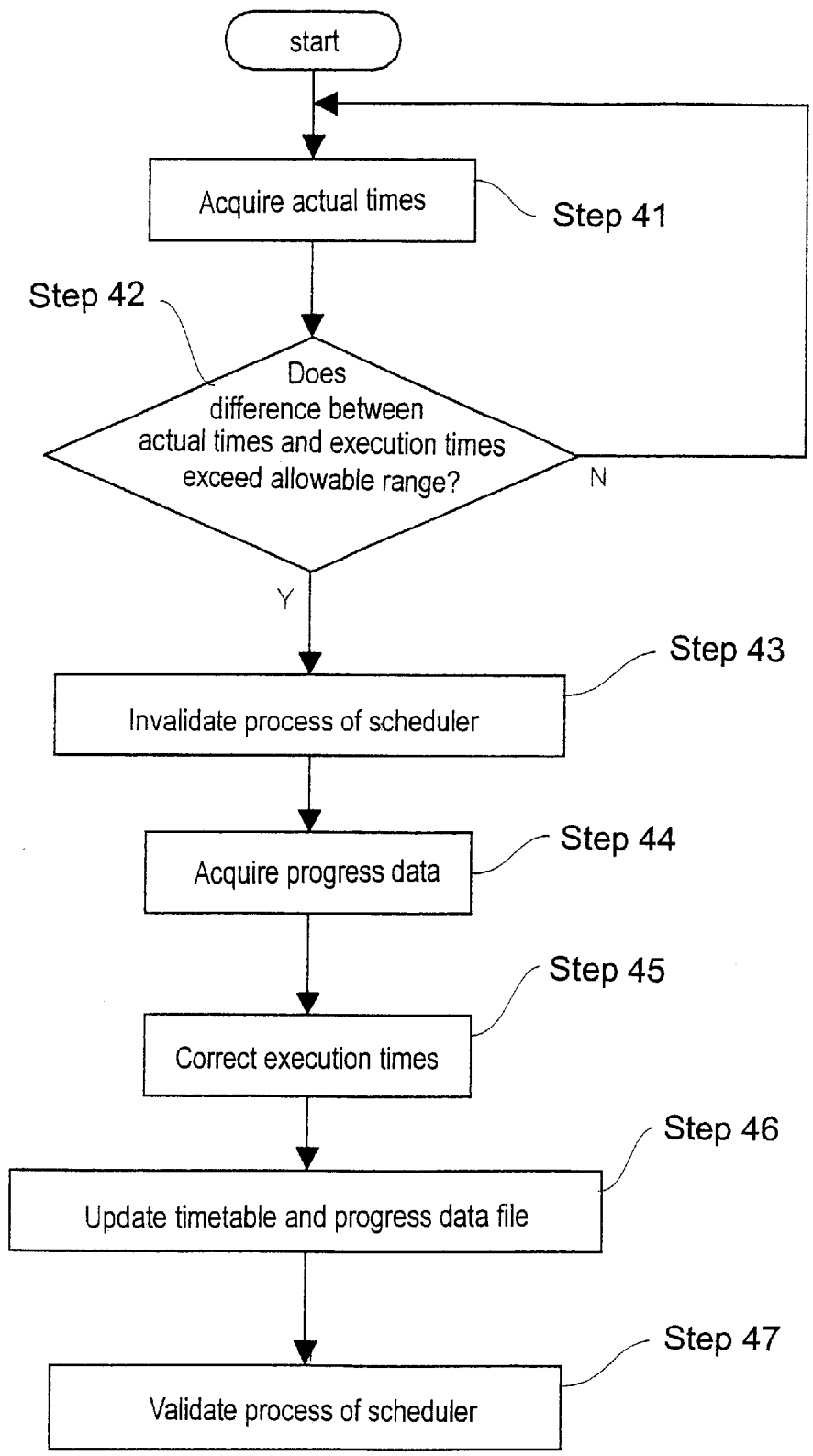
FIG. 9 is a flowchart of a process carried out by a schedule corrector in the substrate transfer controlling apparatus according to the third embodiment of the present invention.

A substrate transfer controlling apparatus according to a third embodiment of the present invention will be described below with reference to FIGS. 8 and 9. FIG. 8 is a block diagram showing a configuration of the substrate transfer controlling apparatus 10 according to the present embodiment.

As shown in FIG. 8, the substrate transfer controlling apparatus 10 according to the third embodiment comprises a scheduler 40, a schedule corrector 50, and an action commander 60, and has a progress data file 19 stored in the hard disk 15. The action commander 60 corresponds to the action commander 36 according to the second embodiment.

The scheduler 40 is constituted by the schedule judging unit, the calculating condition determiner, the schedule calculator, the solution judging unit, the timetable generator, the action commander, and the retrying unit according to the second embodiment. The schedule corrector 50 comprises an actual time acquisition unit 51, a rescheduling judging unit 52, an invalidating unit 53, a progress data acquisition unit 54, a corrector 55, and a validating unit 56. The scheduler 40 and the schedule corrector 50 are provided by a computer program stored in the storage devices 13 through 15 in cooperation with the CPU 11.

A substrate transfer controlling process carried out by the substrate transfer controlling apparatus according to the present embodiment will be described below. FIG. 9 is a flowchart of a process carried out by the schedule corrector 50 in the substrate transfer controlling apparatus according to the present embodiment.

The basic process carried out by the scheduler 40 is the same as the aforementioned process according to the second embodiment, but differs therefrom in that the conditional data including expected action times and expected processing times, the times t(k, n), xr(k, n), and the data of scheduling results such as the scheduled final substrate number and the like are shared as the progress data file 19 with the schedule corrector 50 and updated consistently.

Specifically, when the semiconductor fabrication apparatus starts operation, expected action times of the individual transfer devices are inputted with the input device 12, and stored as the progress data file 19 in the memory 14 or the hard disk 15. After the semiconductor fabrication apparatus starts continuous operation, when expected processing times of each type of the processing devices for substrates are inputted with the input device 12, these expected processing times are also stored as the progress data file 19 in the memory 14 or the hard disk 15. Thereafter, in order to reflect the execution times of actions of the transfer devices as corrected by the schedule corrector 50, the progress data file 19 is read, and the process is carried out up to the step of generating (updating) the timetable 17 with the timetable generator based on the progress data file 19. The results are accumulated in the progress data file 19. The data accumulated in the progress data file 19 which are old and unnecessary are successively deleted at respective times by referring to the numbers of substrates actually fully processed and returned to the cassette.

When the schedule judging unit is to determine whether new scheduling calculations are necessary and when the calculating condition determiner is to determine a final substrate, a limitation may be posed on the range of substrates to be subject to scheduling calculations in view of the storage capacity for the progress data file 19 and the frequency of time corrections.

In the present embodiment, the schedule corrector 50 performs the following process independently of the above process carried out by the scheduler 40.

The actual time acquisition unit 51 acquires times (hereinafter referred to as "actual times") at which the transfer devices 1a through 1c actually start their actions, via the input/output interface 16 (Step 41). Then, the rescheduling judging unit 52 determines the difference between the actual times acquired by the actual time acquisition unit 51 and the execution times scheduled in the past and described in the timetable 17, and determines whether or not the difference exceeds a predetermined allowable range (Step 42).

If the above delay time does not exceed the allowable range, then the actual time acquisition unit 51 acquires actual times again (Step 41). On the other hand, if the above delay time exceeds the allowable range, then the execution times described in the timetable 17 need to be corrected. Therefore, a process described below is performed (Steps 43 through 47). The rescheduling judging unit 52 may determine whether or not actions are inconsistent in relation to the actual times and the execution times described in the timetable 17. For example, when an action of a transfer device is delayed and another transfer device is scheduled to receive a substrate from a relay-type processing device before the above transfer device actually delivers a substrate to the relay-type processing device, such actions are inconsistent, and hence the execution times may be corrected.

When the actual time acquisition unit 51 is to acquire actual times, the actual time acquisition unit 51 may acquire, in addition to the times when the transfer devices start to perform their actions, data representing the progress of the actions, e.g., times to move to processing devices as transfer sources and transfer destinations, times to end receiving and delivering substrates, and times to end processing in processing devices, for correcting execution times with higher accuracy.

The Steps 43 through 47 are carried out as follows:
The invalidating unit 53 invalidates or stops the process of the scheduler 40 (Step 43), and the progress data acquisition unit 54 acquires the progress data by referring to the progress data file 19 (Step 44).

Then, the corrector 55 calculates new (corrected) execution times which satisfy the above equations (1) through (3), as minimum values not smaller than the times scheduled in the past, for actions that are not performed at present, with respect to substrates (including dummy substrates) present on the transfer devices and the processing devices in the semiconductor fabrication apparatus and a single first substrate (including a dummy substrate) to be introduced into the semiconductor fabrication apparatus, based on the progress data and the actual times inputted by the actual time acquisition unit 51 (Step 45). At this time, the final substrate which has been scheduled is the single first substrate to be introduced into the semiconductor fabrication apparatus, and a suitable number of dummy substrates are inserted subsequent to the final substrate for calculation purposes. The corrector 55 then updates the timetable 17 and the progress data file 19 based on the corrected execution times (Step 46).

In calculating the above new execution times, for the sake of brevity, the times scheduled in the past may be shifted altogether back in timed relation to a delay in the latest actual time. The time for a transfer device to end receiving a substrate from a processing device as a transfer source or the time for a transfer device to end delivering a substrate to a processing device as a transfer destination may be compared with the results of the past scheduling process.

Thereafter, the validating unit 56 validates or resumes the process of the scheduler 40 which has been invalidated or stopped by the invalidating unit 53 (Step 47). After being validated or resumed, the scheduler 40 performs its process based on the updated data in the progress data file 19.

If an action of a transfer device is delayed later than expected, the constraint relative to the action times of the transfer device being considered is not necessarily satisfied. Any deviation from the constraint can be reduced to a negligible level by setting a delay reference in the rescheduling judging unit 52 to an appropriate value. After the process of the scheduler 40 has been validated or resumed, it is possible to determine an optimum value in the view of a constraint according to a linear programming process with respect to subsequent substrates, thus eliminating the effect of a time delay in the future.

Figure 10:
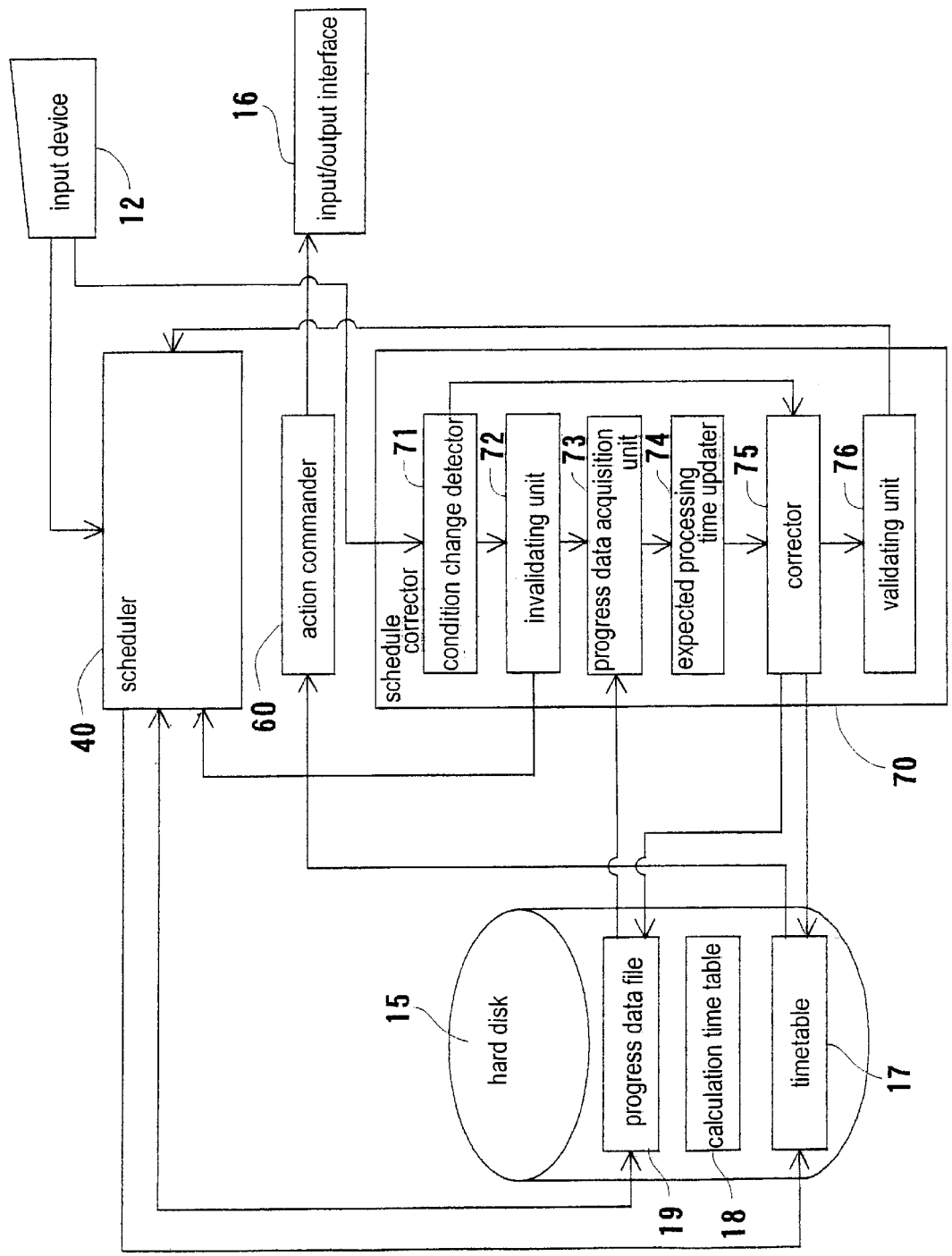
FIG. 10 is a block diagram showing a configuration of a substrate transfer controlling apparatus according to a fourth embodiment of the present invention.
Figure 11:
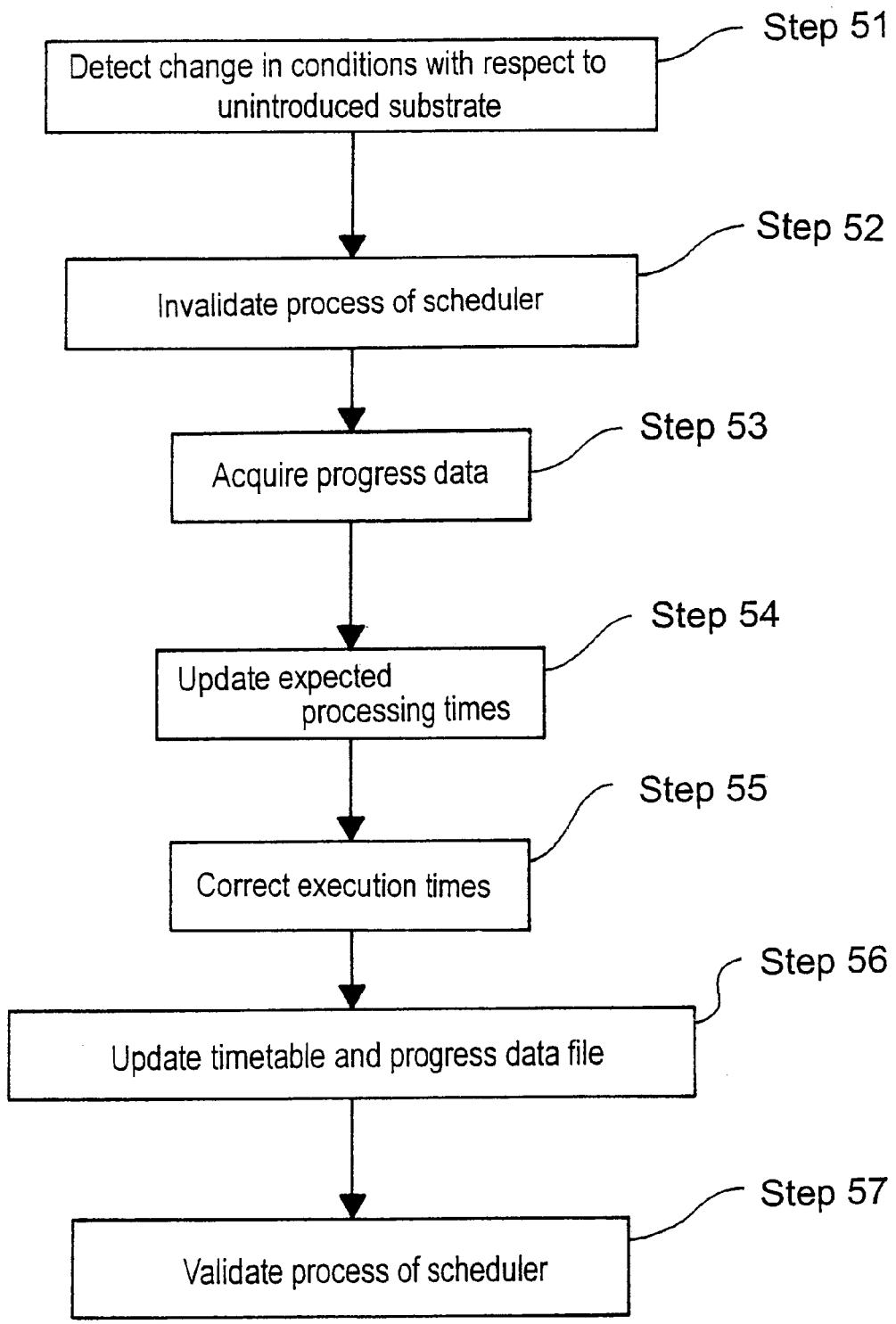
FIG. 11 is a flowchart of a process carried out by a schedule corrector in the substrate transfer controlling apparatus according to the fourth embodiment of the present invention.

A substrate transfer controlling apparatus according to a fourth embodiment of the present invention will be described below with reference to FIGS. 10 and 11. FIG. 10 is a block diagram showing a configuration of the substrate transfer controlling apparatus 10 according to the present embodiment.

As shown in FIG. 10, the substrate transfer controlling apparatus 10 according to the present embodiment comprises a scheduler 40, a schedule corrector 70, and an action commander 60, and has a progress data file 19 stored in the hard disk 15. The scheduler 40 and the schedule corrector 70 are provided by a computer program stored in the storage devices 13 through 15 in cooperation with the CPU 11. The schedule corrector 70 in the present embodiment is constituted by a condition change detector 71, an invalidating unit 72, a progress data acquisition unit 73, an expected processing time updater 74, a corrector 75, and a validating unit 76.

The process performed by the scheduler 40 is the same as the process described above in the second and third embodiments. The schedule corrector 70 performs a process which is different from the process carried out by the schedule corrector 50 according to the third embodiment. The process carried out by the schedule corrector 70 in the present invention will be described below. The process carried out by the schedule corrector 70 is performed independently of the process performed by the scheduler 40. FIG. 11 is a flowchart of the process carried out by the schedule corrector 70 according to the present embodiment.

After the semiconductor fabrication apparatus starts to operate, the condition change detector 71 detects, through the input device 12, whether there is a change in conditions with respect to a substrate (hereinafter referred to as "unintroduced substrate") expected to be introduced into the semiconductor fabrication apparatus, e.g., a cancellation of the introduction of an unintroduced substrate into the semiconductor fabrication apparatus, a change in the expected processing time of an unintroduced substrate, or a change in the sequence of introduction of an unintroduced substrate into the semiconductor fabrication apparatus (Step 51). If the condition change detector 71 detects a change in conditions with respect to an unintroduced substrate, then since execution times described in the timetable 17 need to be corrected, the following process is carried out.

The invalidating unit 72 invalidates or stops the process of the scheduler 40 (Step 52), and the progress data acquisition unit 73 acquires the progress data by referring to the progress data file 19 (Step 53). The expected processing time updater 74 refers to a change in the conditions with respect to an unintroduced substrate (a cancellation of the introduction of an unintroduced substrate into the semiconductor fabrication apparatus, a change in the expected processing time of an unintroduced substrate, or a change in the sequence of introduction of an unintroduced substrate into the semiconductor fabrication apparatus), and updates the data regarding the expected processing times which has been accumulated as part of the progress data (Step 54). For an unintroduced substrate which has been changed in conditions, a new introducing sequence is established, and the expected processing times are updated based on the new introducing sequence. If constraints relative to the transfer are specified for individual substrates, then these constraints are also updated.

If the first substrate for which expected processing times have been updated in Step 54 has already been scheduled in the past, then the corrector 75 cancels the results of the scheduling process for the substrate and subsequent substrates among the results of the past scheduling process in the progress data, and inserts a suitable number of dummy substrates. Then, the corrector 75 calculates new (corrected) execution times which satisfy the above equations (1) through (3), as minimum values not smaller than the times scheduled in the past (Step 55). At this time, the final substrate which has been scheduled is the final substrate for which expected processing times have not been changed in Step 54. The corrector 75 then updates the timetable 17 and the progress data file 19 based on the corrected execution times (Step 56). The time for a transfer device to end receiving a substrate from a processing device as a transfer source or the time for a transfer device to end delivering a substrate to a processing device as a transfer destination may be compared with the results of the past scheduling process.

Thereafter, the validating unit 76 validates or resumes the process of the scheduler 40 which has been invalidated or stopped by the invalidating unit 72 (Step 57). After being validated or resumed, the scheduler 40 performs its process based on the updated data in the progress data file 19. As a result, the execution times of actions on the first substrate and subsequent substrates for which expected processing times have been changed in Step 54 can be recalculated based on the changed expected processing times. Even when a change occurs in the conditions with respect to an unintroduced substrate, such as a cancellation of the introduction of an unintroduced substrate into the semiconductor fabrication apparatus, a change in the expected processing time of an unintroduced substrate, or a change in the sequence of introduction of an unintroduced substrate into the semiconductor fabrication apparatus, the substrate processing apparatus can thus be operated flexibly based on the change in the conditions.

The schedule corrector 70 according to the present embodiment and the schedule corrector 50 according to the third embodiment may be arranged so as to function simultaneously with each other.

As described above, the schedule calculator in each of the above embodiments derives the execution times of actions of the transfer devices such that the time at which the final substrate has been fully processed and returned from the semiconductor fabrication apparatus is made earliest. According to the present invention, even if a certain substrate is instructed not to be processed by a certain processing device, it is possible to calculate the execution times of actions of the transfer devices to transfer the substrate so as to skip the processing device instructed not to process the substrate. The substrate may be instructed not to be processed by the processing device by setting the expected processing time in the processing device for the substrate to zero.

For transferring the substrate to skip the processing device, a suitable number of dummy substrates are inserted immediately before the processing device to be skipped and also immediately prior to the substrate. The execution times are then calculated based on the above linear programming process on the assumption of the inserted dummy substrates. By thus inserting a suitable number of dummy substrates, it is possible to transfer the substrate to skip the processing device. Insertion of such dummy substrates will be described below.

Figure 12:
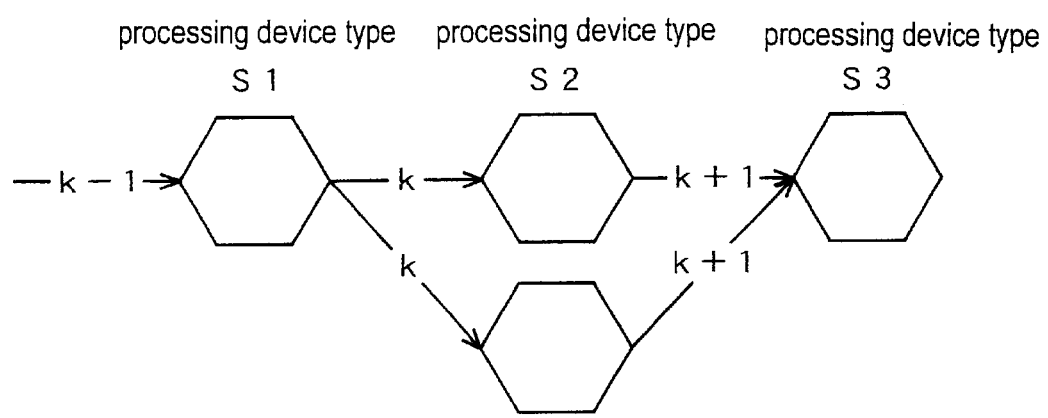
FIG. 12 is a diagram showing an example of an arrangement of a substrate processing apparatus.

It is assumed that processing device types S1 through S3 are installed in a substrate processing apparatus, as shown in FIG. 12. It is also assumed that actions k−1, k, k+1 including the delivery of substrates to the processing device types S1 through S3 are carried out by the same transfer device, and that substrates A, B, C are introduced into and transferred in and processed by the substrate processing apparatus in the order named.

Figure 13:
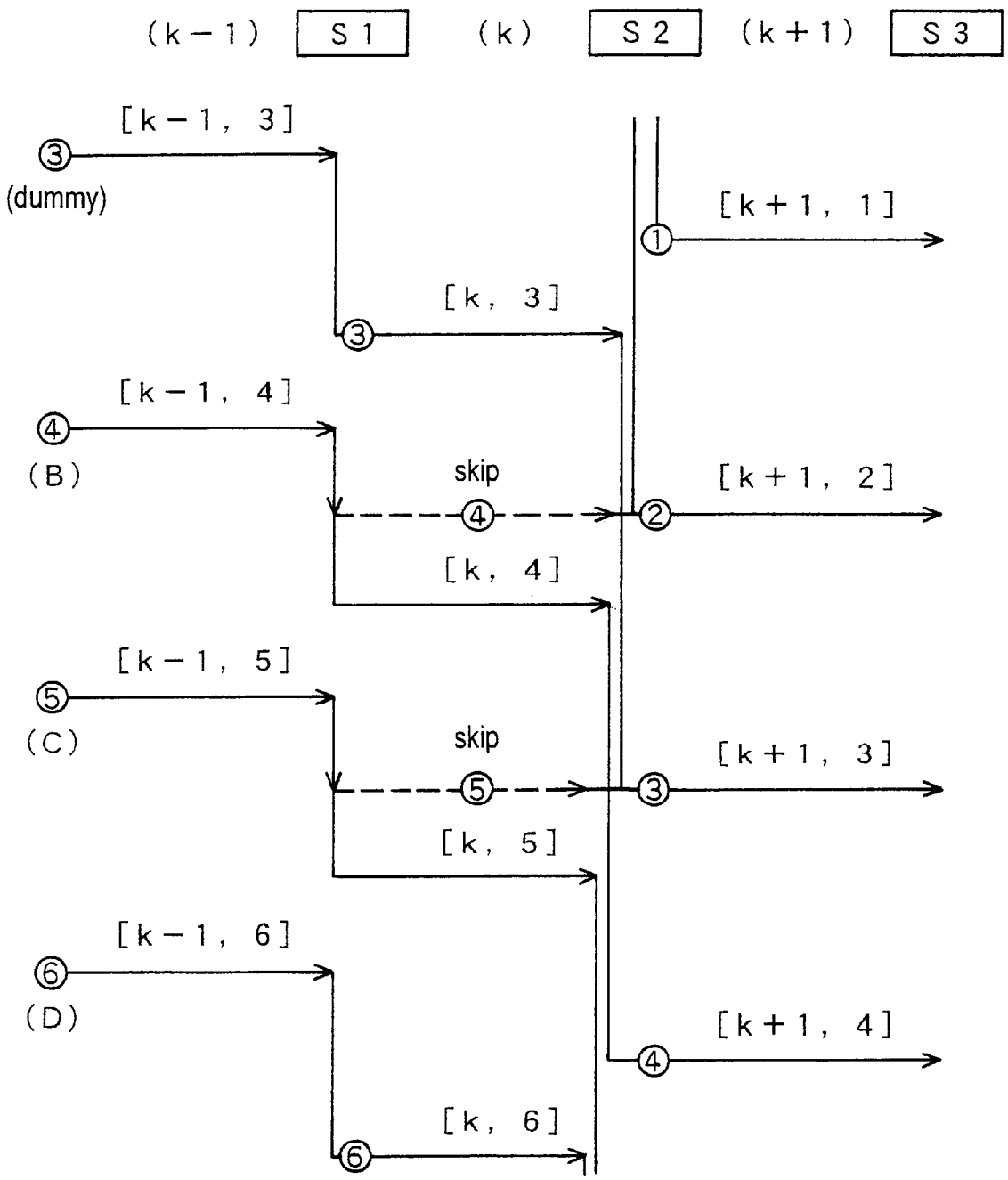
FIG. 13 is a diagram showing an example of a flow of substrates between processing devices in the substrate processing apparatus shown in FIG. 12.
Figure 15:
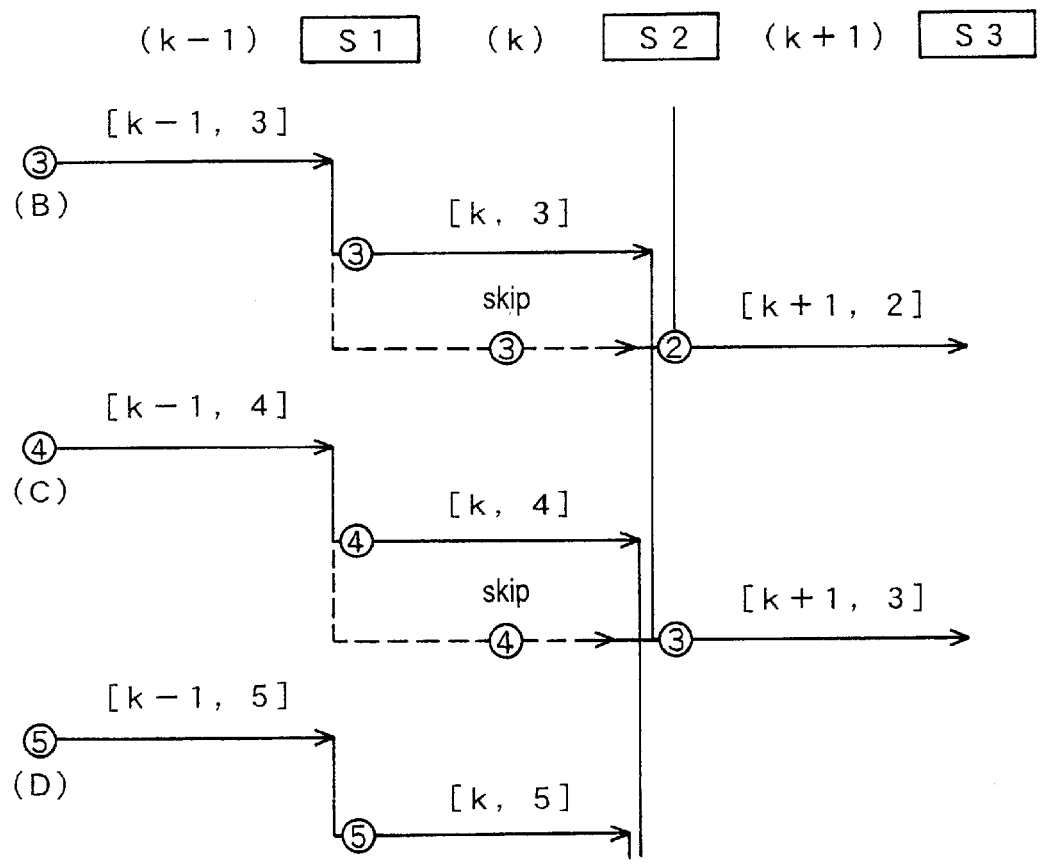
FIG. 15 is a diagram showing an example of a flow of substrates between processing devices in the substrate processing apparatus shown in FIG. 12.

Here, a situation where the expected processing time of the substrates B, C with the processing device type S2 is set to zero, and hence the substrates B, C are transferred to skip the process in the processing device type S2 will be considered. FIGS. 13 and 15 show examples of flows of substrates between the processing device types shown in FIG. 12, with the time axis being directed downwardly.

1) The transfer devices are operated in the order of k+1, k, k−1 during steady operation of the substrate processing apparatus, and the transfer devices are operated in the order of [k+1, 2], [k, 4], [k−1, 5], [k+1, 3], [k, 5], and [k−1, 6] in terms of sets of action numbers and substrate numbers (FIG. 13).

Figure 14A:
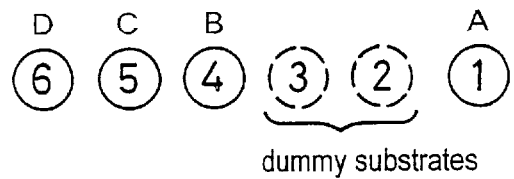
FIGS. 14A and 14B are diagrams showing an order of substrates to be scheduled in FIG. 13.

In this case, as shown in FIG. 14A, a certain number of dummy substrates which correspond to the number of processing devices of the processing device type S2, i.e., two dummy substrates ②, ③ are inserted immediately prior to the substrate B. The processing device type as a transfer source for the action [k+1, 2] on the dummy substrate ② is changed from S2 to S1, and the action [k+1, 2] is carried out prior to an action including the reception of the substrate B (④) from the processing device type S1, i.e., prior to the action [k, 4] in the case of no skipping. As indicated by the dotted line in FIG. 13, the substrate B is transferred from the processing device type S1 to the processing device type S3. In this manner, the action [k+1, 2] does not obstruct the action [k−1, 5] including the delivery of the substrate C (⑤) to the processing device type S1. The action [k, 4] is handled as an action on a dummy substrate, i.e., an insubstantial action of action time of zero.

Similarly, the processing device type as a transfer source for the action [k+1, 3] on the dummy substrate ③ is changed from S2 to S1, and the action [k+1, 3] is carried out prior to the action [k, 5] including the reception of the substrate C (⑤) from the processing device type S1, so as not to obstruct the action [k−1, 6] including the delivery of the substrate D (⑥) to the processing device type S1. As indicated by the dotted line in FIG. 13, the substrate C is transferred from the processing device type S1 to the processing device type S3. The action [k, 5] is also handled as an insubstantial action.

Figure 14B:
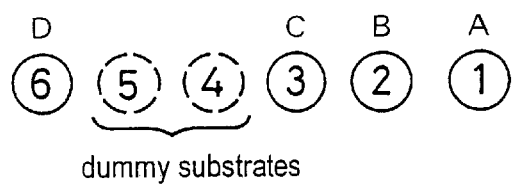

When the above actions are performed, the dummy substrates which were present before the substrates B, C are moved backward of the substrates B, C after the action [k+1, 3], as shown in FIG. 14B.

2) The transfer devices are operated in the order of k, k+1, k−1 during steady operation of the substrate processing apparatus, and the transfer devices are operated in the order of [k, 3], [k+1, 2], [k−1, 4], [k, 4], [k+1, 3], [k−1, 5] in terms of sets of action numbers and substrate numbers (FIG. 15).

Figure 16A:
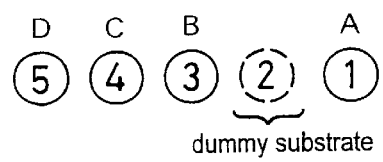
FIGS. 16A and 16B are diagrams showing an order of substrates to be scheduled in FIG. 15.

In this case, as shown in FIG. 16A, a certain number of dummy substrates which correspond to the number 2 of processing devices of the processing device type S2 minus 1, i.e., one dummy substrate ② is inserted immediately prior to the substrate B. The action [k, 3] including the reception of the substrate B (③) from the processing device type S1 is handled as an action on the dummy substrate, and the processing device type as a transfer source for a next action, i.e., the action [k+1, 2] on the dummy substrate ②, is changed from S2 to S1. As a result, as indicated by the dotted line in FIG. 15, the substrate B is transferred from the processing device type S1 to the processing device type S3.

Similarly, the action [k, 4] including the reception of the substrate C (④) from the processing device type S1 is handled as an action on the dummy substrate, and the processing device type as a transfer source for the action [k+1, 3] on the dummy substrate ③ is changed from S2 to S1. As a result, as indicated by the dotted line in FIG. 15, the substrate C is transferred from the processing device type S1 to the processing device type S3.

Figure 16B:
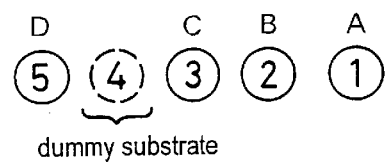

In this manner, the reception of the substrate B from the processing device type S1 is completed before the action [k−1, 4] including the delivery of the substrate C to the processing device type S1, and the reception of the substrate C from the processing device type S1 is also completed before the action [k−1, 5] including the delivery of the substrate D to the processing device type S1. Therefore, the transfer device can transfer these substrates C, D to the processing device type S1 without problems. The dummy substrate which was present before the substrates B, C is moved backward of the substrates B, C after the action [k+1, 3], as shown in FIG. 16B.

In the above description, one processing device type is skipped, and the action k−1 is carried out by the same transfer device as the actions k, k+1. For transferring a substrate so as to skip a plurality of processing device types, dummy substrates are inserted in view of all those processing device types to be skipped to allow the substrate to be transferred while skipping those processing device types.

Even if the action k−1 is carried out by another transfer device, an action of a transfer device for receiving a substrate from and delivering a substrate to the other transfer device via a relay-type processing device type is taken into consideration instead of the action k−1, and the number of dummy substrates to be inserted is determined so as not to affect the action sequence of the other transfer device for thereby making it possible to skip the processing transfer device types.

Figure 17:
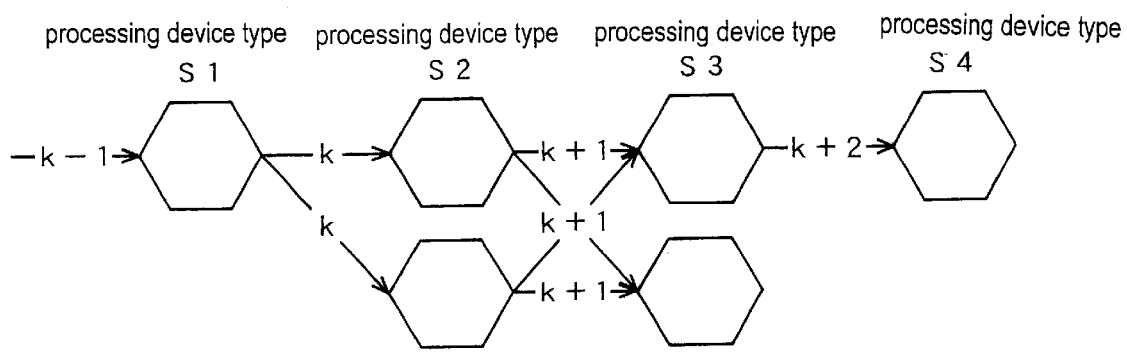
FIG. 17 is a diagram showing an example of an arrangement of a substrate processing apparatus.
Figure 18:
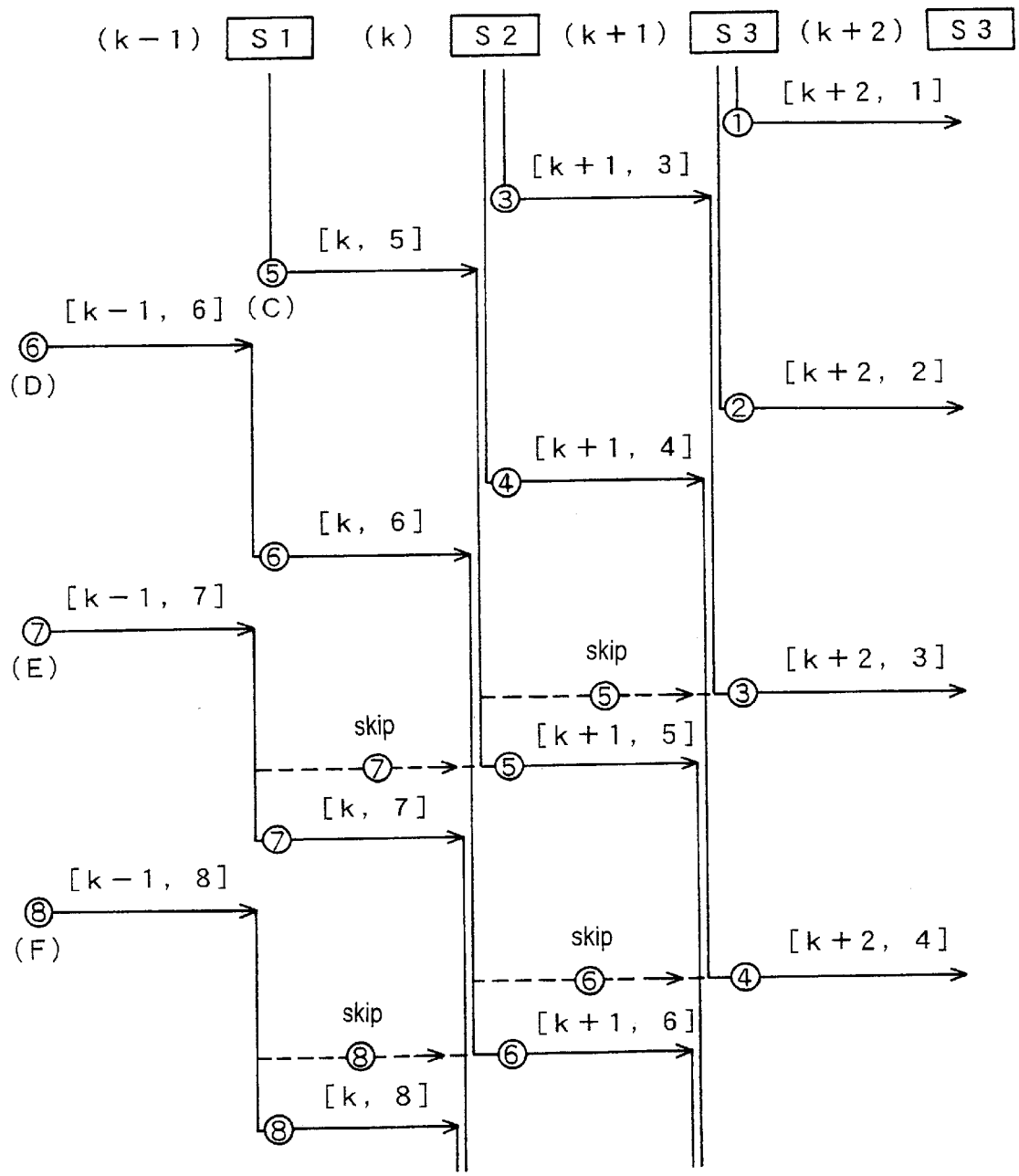
FIG. 18 is a diagram showing an example of a flow of substrates between processing devices in the substrate processing apparatus shown in FIG. 17.

Next, it is assumed that processing device types S1 through S4 are installed in a substrate processing apparatus, as shown in FIG. 17. It is also assumed that actions k−1, k, k+1, k+2 including the delivery of substrates to the processing device types S1 through S4 are carried out by the same transfer device, and that substrates A, B, C, D, E, F are introduced into and transferred in and processed by the substrate processing apparatus in the order named. It is further assumed that the action sequence of the transfer device is represented by k+2, k+1, k, k−1 during steady operation of the substrate processing apparatus, and the actions of the transfer device are performed in the order shown in FIG. 18, with the time axis being directed downwardly in FIG. 18.

Here, a situation where the substrates C, D are transferred so as to skip the process in the processing device type S3 and the substrates E, F are transferred so as to skip the process in the processing device type S2 will be considered.

Figure 19A:
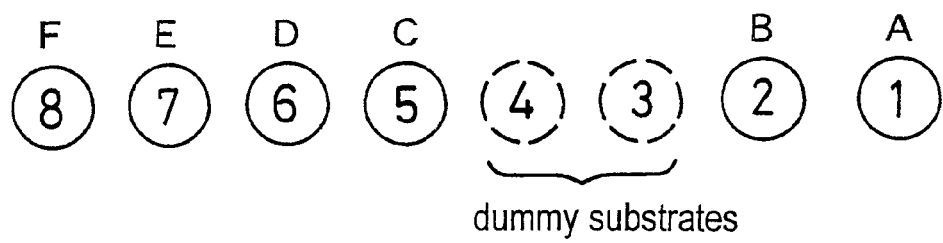
FIGS. 19A through 19C are diagrams showing an order of substrates to be scheduled in FIG. 18.

In this case, as shown in FIG. 19A, a certain number of dummy substrates which correspond to the number of processing devices of the processing device type S3, i.e., two dummy substrates ③, ④ are inserted immediately prior to the substrate C. The processing device type as a transfer source for the action [k+2, 3] on the dummy substrate ③ is changed from S3 to S2, and the action [k+2, 3] is carried out prior to the action [k+1, 5] including the reception of the substrate C (⑤) from the processing device type S2. Thus, the substrate C is transferred so as to skip the processing device type S3.

Figure 19B:
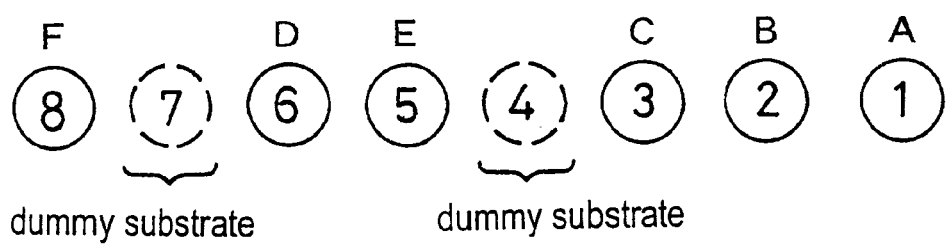

Further, the processing device type as a transfer source for the action [k+1, 5] is changed from S2 to S1, and the action [k+1, 5] is carried out prior to the action [k, 7] including the reception of the substrate E (⑦) from the processing device type S1. Thus, the substrate E is transferred so as to skip the processing device type S2. At this time, one of the dummy substrates is moved backward of the substrate D, as shown in FIG. 19B.

Similarly, the processing device type as a transfer source for the action [k+2, 4] is changed from S3 to S2, and the action [k+2, 4] is carried out prior to the action [k+1, 6] including the reception of the substrate D from the processing device type S2. Thus, the substrate D is transferred so as to skip the processing device type S3.

Figure 19C:
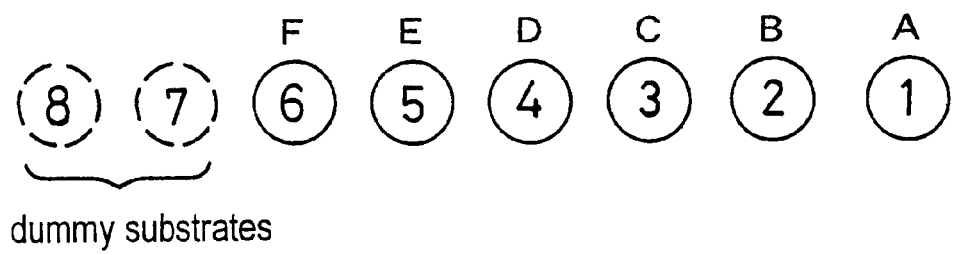

Furthermore, the processing device type as a transfer source for the action [k+1, 6] is changed from S2 to S1, and the action [k+1, 6] is carried out prior to the action [k, 8] including the reception of the substrate F (⑧) from the processing device type S1. Thus, the substrate F is transferred so as to skip the processing device type S2. At this time, the two dummy substrates are moved backward of the substrate F, as shown in FIG. 19C.

According to the present invention, since each of substrates can be transferred so as to skip an unwanted processing device type or types and a plurality of processing device types can selectively be used depending on the purpose of processes performed thereby while the substrate processing apparatus is being continuously operated, the substrate processing apparatus can flexibly be operated for multi-product small-lot production. For example, the throughput can be made much greater than that in the case where the continuous operation is temporarily stopped and substrates to be processed differently are handled. The cost can also be made much lower than that in the case where different substrate processing apparatuses are employed to serve different processing purposes.

When the schedule calculator (denoted by the reference numeral 21 in FIG. 3, the reference numeral 33 in FIG. 5) is arranged in view of skipping processing device types, the corrector (denoted by the reference numeral 55 in FIG. 8, the reference numeral 75 in FIG. 10) is also arranged in view of skipping processing device types.

Figure 20:
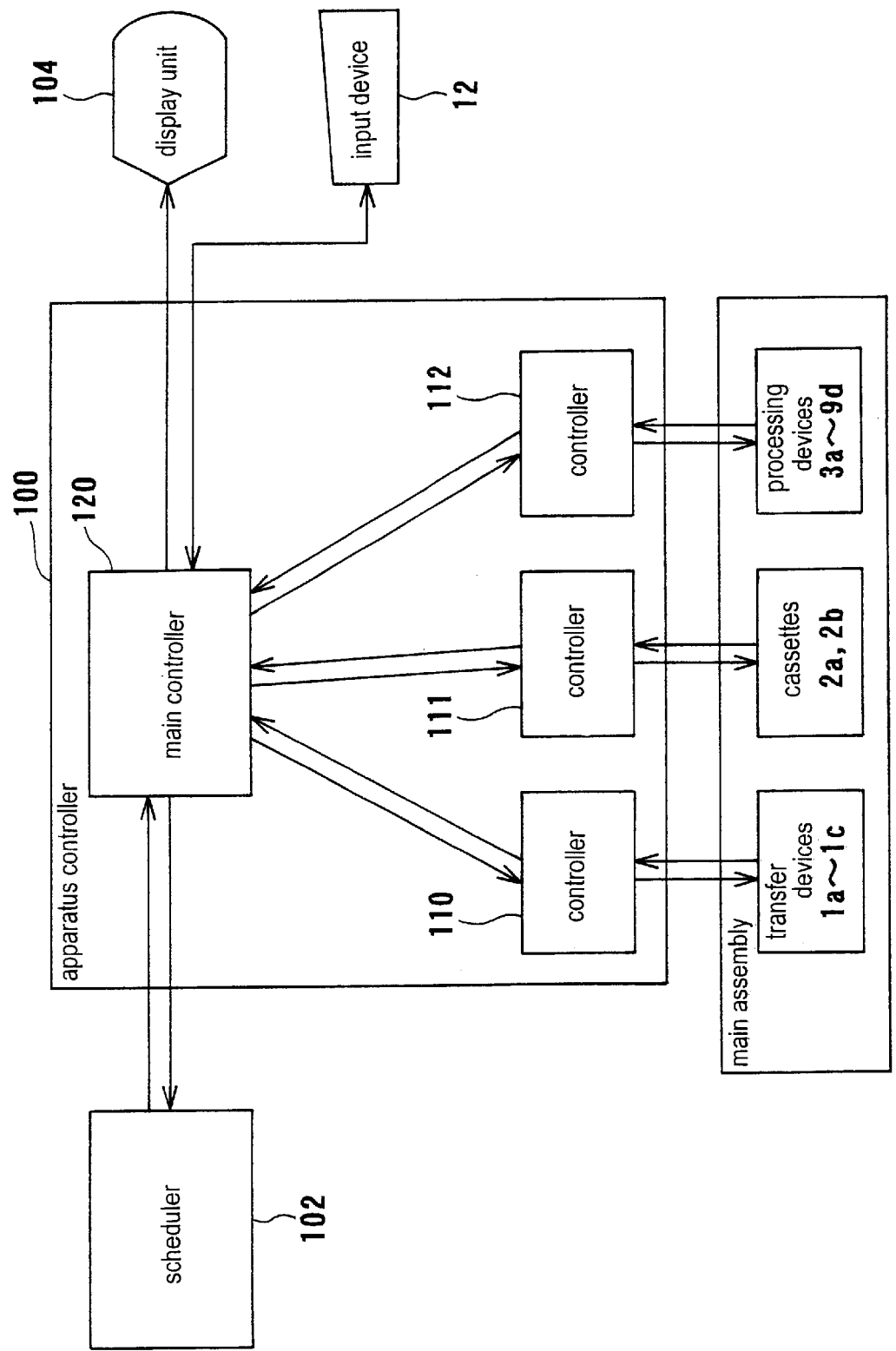
FIG. 20 is a block diagram showing an overall arrangement of a substrate processing apparatus incorporating a substrate transfer controlling apparatus according to the present invention.

A substrate processing apparatus incorporating a substrate transfer controlling apparatus according to the present invention will be described below with reference to the accompanying drawings. FIG. 20 is a block diagram showing an overall arrangement of a substrate processing apparatus (semiconductor fabrication apparatus) according to the present embodiment. The substrate processing apparatus has the transfer devices 1a through 1c, the cassettes 2a, 2b, and the processing devices 3a through 9d shown in FIG. 1 as a main assembly. The substrate processing apparatus also has an apparatus controller 110 comprising a computer or the like, a scheduler 102 comprising an independent computer or the like, a display unit 104 for displaying statuses of the apparatus, and the aforementioned input device 12 for inputting operating conditions and control conditions of the apparatus.

Storage devices in the apparatus controller 100 and the scheduler 102 store a computer program for controlling substrates and a computer program for controlling the apparatus. The apparatus controller 100 and the scheduler 102 may be implemented by a plurality of computers in cooperation with each other or a single computer.

The apparatus controller 100 mainly comprises controllers 110 through 112 connected to the transfer devices 1a through 1c, the cassettes 2a, 2b, and the processing devices 3a through 9d in the main assembly, and a main controller 120 connected to the controllers 110 through 112. The controllers 110 through 112 receive commands from the main controller 120 and transmit the commands to the devices 1a through 9d. The controllers 110 through 112 monitor the devices 1a through 9d and transmit signals representative of the statuses of the devices 1a through 9d to the main controller 20. The main controller 120 has a function to transmit starting commands, processing conditions, and the like to the processing devices 3a through 9d, and also includes an action commander (denoted by the reference numeral 24 in FIG. 3, the reference numeral 36 in FIG. 5, the reference numeral 60 in FIGS. 8 and 10), an actual time acquisition unit (denoted by the reference numeral 51 in FIG. 8), a rescheduling judging unit (denoted by the reference numeral 52 in FIG. 8), and a condition change detector (denoted by the reference numeral 71 in FIG. 10), all for controlling the transfer devices. The display unit 104 and the input device 12 are connected to the main controller 120.

The scheduler 102 includes a schedule calculator (denoted by the reference numeral 21 in FIG. 3, the reference numeral 33 in FIG. 5), a solution judging unit (denoted by the reference numeral 22 in FIG. 3, the reference numeral 34 in FIG. 5), a retrying unit (denoted by the reference numeral 25 in FIG. 3, the reference numeral 37 in FIG. 5), a timetable generator (denoted by the reference numeral 23 in FIG. 3, the reference numeral 35 in FIG. 5), a schedule judging unit (denoted by the reference numeral 31 in FIG. 5), a calculating condition determiner (denoted by the reference numeral 32 in FIG. 5), an invalidating unit (denoted by the reference numeral 53 in FIG. 8, the reference numeral 72 in FIG. 10), a progress data acquisition unit (denoted by the reference numeral 54 in FIG. 8, the reference numeral 73 in FIG. 10), a corrector (denoted by the reference numeral 55 in FIG. 8, the reference numeral 75 in FIG. 10), a validating unit (denoted by the reference numeral 56 in FIG. 8, the reference numeral 76 in FIG. 10), and an expected processing time updater (denoted by the reference numeral 74 in FIG. 10).

The above arrangements of the main controller 120 and the scheduler 102 are examples thereof, and the main controller 120 and the scheduler 102 may of course be arranged differently.

Operation of the substrate processing apparatus incorporating the substrate transfer controlling apparatus will be described below.

The power supply of the main assembly is ganged with the power supplies of the apparatus controller 100, the display unit 104, the input device 12, and the scheduler 102. When the power supply of the main assembly is turned on, the power supplies of the apparatus controller 100, the display unit 104, the input device 12, and the scheduler 102 are automatically turned on, for thereby activating the apparatus controller 100, the display unit 104, the input device 12, and the scheduler 102. At this time, the scheduler 102 is in a standby state waiting for a signal from the main controller 120.

Before the main assembly is operated, information as to whether the processing devices 3a through 9d are to be used or not, a transferring path indicative of the sequence of transfer of substrates between the types of the processing devices 3a through 9d with the transfer devices 1a through 1c, and the sequence of basic actions of the transfer devices 1a through 1c in steady operation of the substrate processing apparatus are inputted with the input device 12. The main controller 120 may transmit action commands to the transfer devices 1a through 1c in the main assembly to operate the transfer devices 1a through 1c, and acquire times required for the actions of the transfer devices 1a through 1c. If the acquired times and other settings are stored in a magnetic disk or a nonvolatile memory in the apparatus controller 100, then the substrate processing apparatus can be operated based on those acquired times and other settings even after the power supply thereof is turned off.

When a starting command for operation of the apparatus is inputted with the input device 12, the main controller 120 instructs the devices to start their processing, i.e., to return the transfer devices 1*a* through 1*c* to their home positions and initialize the processing devices 3*a* through 9*d*, and also transmits an operation starting command and data indicative of the transferring path, the sequence of basic actions, and expected action times to the scheduler 102. The scheduler 102 reads these data and performs an initializing process such as a setting process of its internal memory.

When the cassettes 2*a*, 2*b* loaded with unprocessed substrates are mounted in the main assembly, expected processing times for those unprocessed substrates and constraints about the transfer of the unprocessed substrates are inputted with the input device 12. These inputted data are transmitted via the main controller 120 to the scheduler 102.

The scheduler 102 reads the data of the expected processing times and the constraints, generates a timetable by calculating execution times of the actions with respect to the first substrate according to the above substrate transfer controlling process, and transmits the generated timetable to the main controller 120. Based on the timetable, the main controller 120 starts the actions of the transfer devices and the processes in the processing devices corresponding to the actions of the transfer devices, and starts measuring the execution times of the actions. When transmitting action commands to the transfer devices 1*a* through 1*c*, the main controller 120 confirms not only the passage of times indicated in the timetable, but also that the transfer devices are inoperative, the processing of substrates in processing devices as transfer sources has been completed, and preceding substrates are not present in processing devices as transfer destinations and the resetting of those processing devices has been completed. In this manner, no problem occurs even if the action times of the transfer devices 1*a* through 1*c*, the processing times of the processing devices 3*a* through 9*d*, and the reset times deviate from expected times.

Simultaneously with transmitting the action commands, the main controller 120 transmits the execution times of the actions to the scheduler 120, and also transmits information about the positions of the substrates and the progress of the processes to the output device 104. Subsequently, these status data of the main assembly are continuously transmitted at suitable given intervals.

Then, the scheduler 102 sets a suitable number of additional substrates with respect to the second and subsequent substrates for which expected processing times have initially been acquired, successively schedules the substrates according to a linear programming process, and transmits an updated timetable to the main controller 120. Prior to transmitting such an updated timetable, the scheduler 120 may transmit a command to stop the clock in the main controller 120 to inhibit new actions from being started, may transmit only commands corresponding to unperformed actions in the timetable, and then may restart the clock in the main controller 120 after transmitting those commands. In view of the storage capacity of the storage devices in the main controller 120, the timetable may be stored and accumulated in the storage devices in the scheduler 102, and a certain amount of schedule with unperformed actions at first may periodically be transmitted sequentially to the main controller 120 irrespective of the timing of scheduling calculations.

When a cassette loaded with new unprocessed substrates is mounted in the main assembly, expected processing times and constraints of the transfer thereof are inputted in the same manner as described above. The inputted data are transmitted from the main controller 120 to the scheduler 102. The scheduler 102 reads these data, accumulates them in the progress data file, and continues the above successive scheduling according to the linear programming process.

When expected action times have been calculated with respect to all unintroduced substrates for which expected processing times have been inputted, the scheduler 102 waits until the expected processing time of a next unintroduced substrate is inputted.

While the main assembly is being in operation, the main controller 120 measures the execution times of respective actions, and monitors any differences between the measured times and the times indicated in the timetable. If the action times of the transfer devices 1*a* through 1*c*, the processing times of the processing devices 3*a* through 9*d*, and the reset times are delayed, then the execution time of a certain action may be delayed as a result. In such a case, the rescheduling judging unit in the main controller 120 transmits a time correction command to the scheduler 102, which corrects the execution time of the unperformed action to update the timetable and transmits the updated timetable to the main controller 120. The main controller 120 stops the clock before transmitting the time correction command, and restarts the clock after having received the timetable, so that the corrected timetable and actual actions are consistent with each other.

When the mounted cassette loaded with unprocessed substrates is removed from the main assembly, or the expected introduction of unintroduced substrates is canceled, or the expected processing times thereof are changed, or the sequence of introduction of unintroduced substrates into the main assembly is changed with the input device 12, the information indicative of the above event is transferred together with a correction command for the unintroduced substrates from the main controller 120 to the scheduler 102. The scheduler 102 updates a portion of the timetable, and transmits the updated timetable to the main controller 120. As in the case of the time correction command, the main controller 120 stops the clock before a correction command for the unintroduced substrates is transmitted to the scheduler 102, and restarts the clock after having received the timetable.

When all the substrates loaded in the cassette mounted in the main assembly have been fully processed and returned to the cassette, the main controller 120 stops checking whether or not there is a transmission from the scheduler 102, performs an ending process such as a releasing process of the memory, and returns to the state subsequent to the activation. The scheduler 102 and the input device 12 also return to the state subsequent to the activation. In this case, the transferring path, the sequence of basic actions, and expected action times for a next cycle of operation may be reset with the input device 12. Alternatively, an operation starting command may be inputted again with the same settings to resume the processing of substrates for a cassette loaded with unprocessed substrates.

Figure 21:
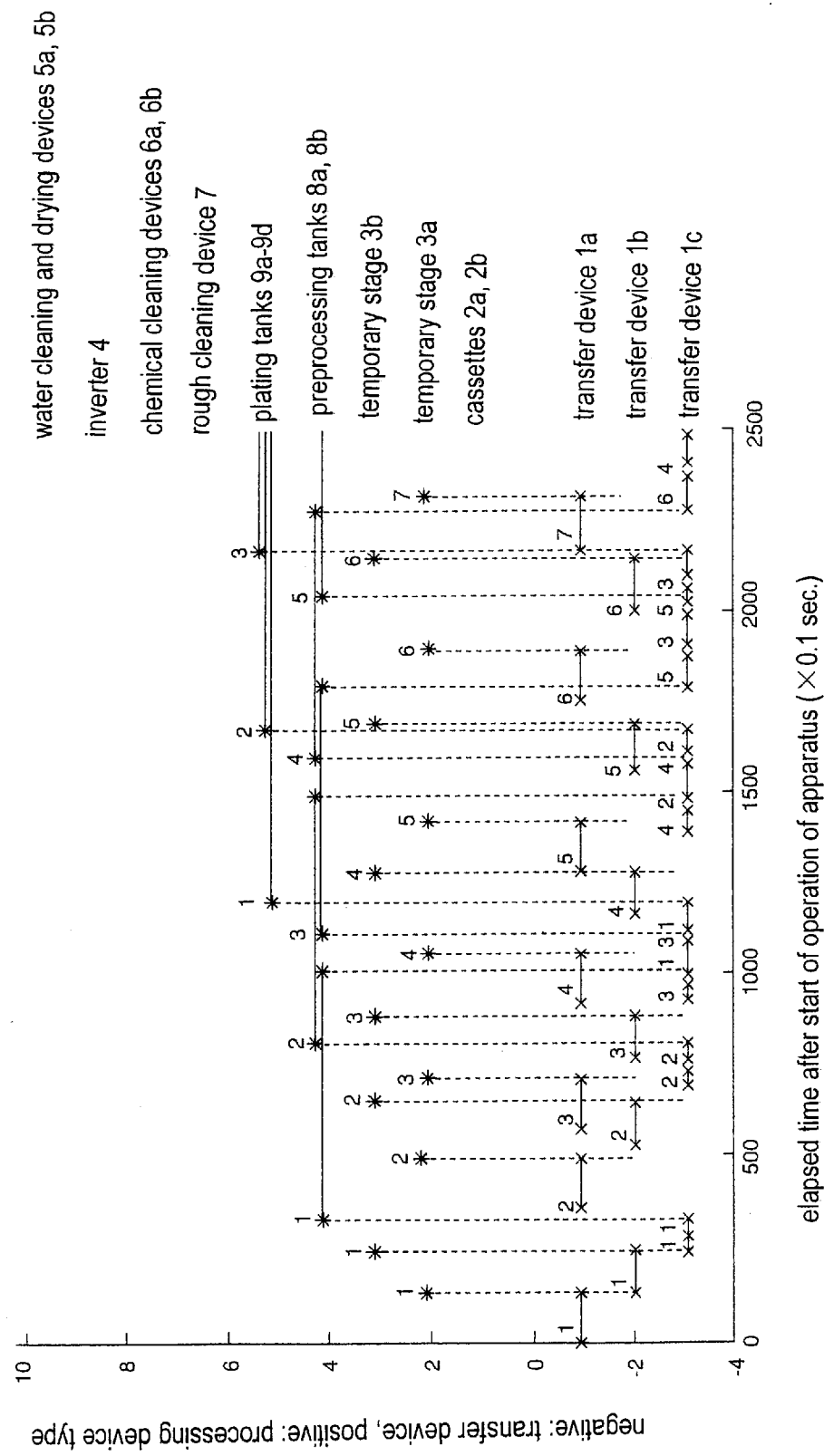
FIG. 21 is a diagram showing the scheduled result obtained by scheduling execution times of transfer devices with use of a substrate transfer controlling apparatus according to the second embodiment of the present invention, immediately after the substrate transfer controlling apparatus has started to operate.
Figure 22:
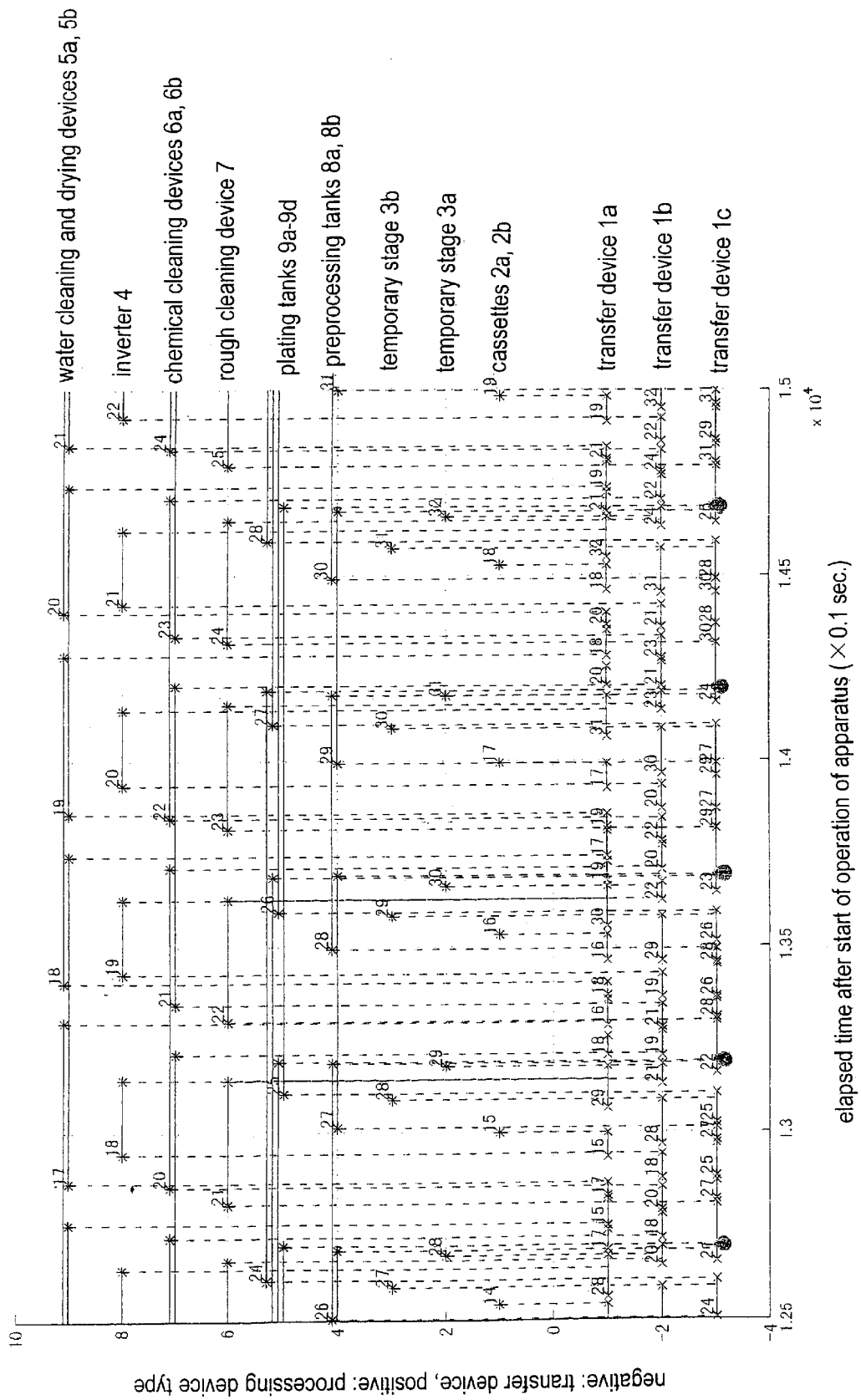
FIG. 22 is a diagram showing the scheduled result obtained by scheduling execution times of transfer devices with use of a substrate transfer controlling apparatus according to the second embodiment of the present invention, after elapse of a certain time from the start of operation of the substrate transfer controlling apparatus.

FIGS. 21 and 22 show examples of the scheduled results obtained by scheduling execution times of transfer devices using the substrate transfer controlling apparatus according to the second embodiment. In FIGS. 21 and 22, the numerals represent substrate numbers, solid lines sandwiched by × corresponding to the transfer devices 1*a* through 1*c* indicate that the transfer devices are in operation, and solid lines sandwiched by * corresponding to the processing devices 3*a* through 9*d* indicate that the processing devices are processing substrates.

FIG. 21 shows the scheduled results obtained immediately after the substrate transfer controlling apparatus has started to operate. It can be seen from FIG. 21 that the transfer devices 1a through 1c have a large allowance at the time immediately after the substrate transfer controlling apparatus has started to operate.

FIG. 22 shows the scheduled results obtained in a steady state after elapse of a certain time from the start of operation of the substrate transfer controlling apparatus. In FIG. 22, the quiescent time of each of the transfer devices is small, and the transfer devices are almost fully in operation. However, with respect to the plating tanks 9a through 9d having a constraint of no waiting time to wait for transfer device after the processing of substrates, the transfer device starts moving toward the plating tanks before the processing of substrates is ended, receives the substrates immediately after they are processed, and transfers them to the rough cleaning device 7, as indicated by • in FIG. 22.

According to the present invention, as described above, since the execution times of actions of the transfer devices can be scheduled so that the time when a final one of the substrates to be processed is fully processed and returned from the substrate processing apparatus is made earliest, the throughput of the substrate processing apparatus can be maximized.

The time when a final one of the substrates to be processed is fully processed and returned from the substrate processing apparatus can be made earliest while satisfying constraints set in relation to the action times of the transfer devices without the need for an awkward advance review and limitations on expected processing times. Therefore, requirements for the processing of substrates can be met, and the throughput of the substrate processing apparatus can be maximized.

Even in a situation where the expected processing times of substrates while the substrate processing apparatus is in continuous operation can sequentially be obtained in divided forms, the throughput can approximately be maximized while satisfying limitations on the processing of substrates.

Because the number of additional substrates to be scheduled can be presumed in view of a calculable number of substrates in each scheduling attempt, a computer of relatively low processing capability can perform a scheduling process.

Even if actions of transfer devices or the processing of substrates in processing devices is delayed behind expected times, it is possible to minimize any effects of the delay on limitations on the processing of substrates and the throughput, and the substrate processing apparatus can be operated without allowing such effects to remain in the future.

Even if there is a change in conditions with respect to an unintroduced substrate, e.g., a cancellation of the processing of the substrate, a change in the expected processing time of the substrate, or a change in the sequence of introduction of the substrate into the substrate processing apparatus, the substrate processing apparatus can be operated flexibly based on the change in the conditions.

Since a substrate can be transferred to skip an unwanted processing device type or types while the substrate processing apparatus is being continuously operated, a plurality of processing device types can selectively be used depending on the purpose of processes performed thereby. Therefore, the throughput of the substrate processing apparatus can greatly be increased, and the substrate processing apparatus can be operated flexibly for multi-product small-lot production.

INDUSTRIAL APPLICABILITY

The present invention is suitable for use in a substrate transfer controlling apparatus for transferring a plurality of substrates in a substrate processing apparatus such as a semiconductor fabrication apparatus, with transfer devices, successively to a plurality of processing devices for processing the substrates therein, and a substrate processing apparatus in which the transfer of substrates is controlled by such a substrate transfer controlling apparatus.

What is claimed is:

1. The substrate transferring method of transferring substrates with a transfer device between a plurality of processing devices installed in a substrate processing apparatus, said substrate transferring method characterized by comprising:

calculating execution times of actions of said transfer device for allowing the time when a final one of said substrates to be processed is fully processed and returned from said substrate processing apparatus to be earliest, based on a predetermined conditional formula including, as parameters, times required for said actions of said transfer device and times required to process said substrates in said processing devices, under a constraint relative to the time to operate said transfer device; and instructing the corresponding transfer device to perform said actions at the calculated execution times of said actions of said transfer device.

2. The substrate transferring method according to claim 1 characterized in that said execution times of said actions of said transfer device are calculated according to a linear programming process.

3. The substrate transferring method according to claim 1 characterized by further comprising:

determining whether or not a solution of said execution times of said actions of said transfer device is obtained based on said conditional formula; and when it is determined that a solution of said execution times is not obtained, correcting said conditional formula so as to reduce the average number of substrates which are simultaneously present in said substrate processing apparatus, and retrying calculating said execution times based on the corrected conditional formula.

4. The substrate transferring method according to claim 1 characterized by further comprising:

determining whether or not it is necessary to newly calculate execution times of actions of said transfer device after said substrate processing apparatus has started to operate;

when it is determined that it is necessary to newly calculate execution times of actions of said transfer device, determining an assumed time serving as a stating point of calculation of new execution times and a final substrate to be processed in calculating said execution times; and while holding the result of a past scheduling process prior to said determined assumed time, calculating new execution times of actions for substrates up to said determined final substrate.

5. The substrate transferring method according to claim 1 characterized by further comprising:

acquiring times when said transfer device starts said actions thereof;

determining whether or not said acquired times and the execution times in the result of the past scheduling process are inconsistent with each other or differ from each other by at least a predetermined range; and when it is determined that said acquired times and the execution times in the result of the past scheduling process are inconsistent with each other or differ from each other by at least said predetermined range, correcting said execution times of said actions of said transfer device which are not performed at that time.

6. The substrate transferring method according to claim 1 characterized by further comprising:
   detecting a change in conditions with respect to a substrate expected to be introduced into said substrate processing apparatus after said substrate processing apparatus has started to operate; and
   when a change in conditions with respect to said substrate is detected, correcting said execution times of said actions of said transfer device on the substrate for which a condition is changed and substrates subsequent to said substrate for which a condition is changed.

7. The substrate transferring method according to claim 1 characterized in that when the process of at least one processing device in said substrate processing apparatus with respect to at least one substrate is omitted, said execution times of said actions of said transfer device are calculated so as to transfer said at least one substrate to skip said at least one processing device.

8. A substrate transfer controlling apparatus for controlling transfer of substrates with a transfer device between a plurality of processing devices installed in a substrate processing apparatus, said substrate transfer controlling apparatus characterized by comprising:
   an input device for inputting times required for actions of said transfer device and times required to process substrates in said processing devices;
   a schedule calculator for calculating execution times of actions of said transfer device for allowing the time when a final one of said substrates to be processed is fully processed and returned from said substrate processing apparatus to be earliest, based on a predetermined conditional formula including, as parameters, said times inputted with said input device, under a constraint relative to the time to operate said transfer device; and
   an action commander for instructing the corresponding transfer device to perform said actions at said execution times of said actions of said transfer device which are calculated by said schedule calculator.

9. The substrate transfer controlling apparatus according to claim 8 characterized in that said schedule calculator calculates said execution times of said actions of said transfer device according to a linear programming process.

10. The substrate transfer controlling apparatus according to claim 8 characterized by further comprising:
    a solution judging unit for determining whether or not a solution of said execution times of said actions of said transfer device is obtained by said schedule calculator; and
    a retrying unit for, when it is determined by said solution judging unit that a solution of said execution times is not obtained, correcting said conditional formula so as to reduce the average number of substrates which are simultaneously present in said substrate processing apparatus, and retrying calculating said execution times by said schedule calculator.

11. The substrate transfer controlling apparatus according to claim 8 characterized by further comprising:
    a schedule judging unit for determining whether or not it is necessary to newly calculate execution times of actions of said transfer device by said schedule calculator after said substrate processing apparatus has started to operate; and
    a calculating condition determiner for, when it is determined by said schedule judging unit that it is necessary to newly calculate execution times of actions of said transfer device, determining an assumed time serving as a stating point of calculation of new execution times and a final substrate to be processed in calculating said execution times by said schedule calculator;
    wherein said schedule calculator calculates new execution times of actions for substrates up to said final substrate determined by said calculating condition determiner while holding the result of a past scheduling process prior to said assumed time determined by said calculating condition determiner.

12. The substrate transfer controlling apparatus according to claim 8 characterized by further comprising:
    an actual time acquisition unit for acquiring times when said transfer device starts said actions thereof;
    a rescheduling judging unit for determining whether or not said times acquired by said actual time acquisition unit and the execution times in the result of the past scheduling process are inconsistent with each other or differ from each other by at least a predetermined range; and
    a corrector for, when it is determined by said rescheduling judging unit that said acquired times and the execution times in the result of the past scheduling process are inconsistent with each other or differ from each other by at least said predetermined range, correcting said execution times of said actions of said transfer device which are not performed at that time.

13. The substrate transfer controlling apparatus according to claim 8 characterized by further comprising:
    a condition change detector for detecting a change in conditions with respect to a substrate expected to be introduced into said substrate processing apparatus after said substrate processing apparatus has started to operate; and
    a corrector for, when a change in conditions with respect to said substrate is detected by said condition change detector, correcting said execution times of said actions of said transfer device on the substrate for which a condition is changed and substrates subsequent to said substrate for which a condition is changed.

14. The substrate transfer controlling apparatus according to claim 8 characterized in that when the process of at least one processing device in said substrate processing apparatus with respect to at least one substrate is omitted, said schedule calculator calculates said execution times of said actions of said transfer device so as to transfer said at least one substrate to skip said at least one processing device.

15. A substrate processing apparatus having a plurality of processing devices for processing substrates while transferring said substrates with a transfer device between said processing devices, said substrate processing apparatus characterized by comprising:
    an input device for inputting times required for actions of said transfer device and times required to process substrates in said processing devices;
    a schedule calculator for calculating execution times of actions of said transfer device for allowing the time when a final one of said substrates to be processed is fully processed and returned from the apparatus to be earliest, based on a predetermined conditional formula including, as parameters, said times inputted with said input device, under a constraint relative to the time to operate said transfer device; and an action commander for instructing the corresponding transfer device to perform said actions at said execution times of said actions of said transfer device which are calculated by said schedule calculator.

16. The substrate processing apparatus according to claim 15 characterized in that said schedule calculator calculates said execution times of said actions of said transfer device according to a linear programming process.

17. The substrate processing apparatus according to claim 15 characterized by further comprising:

a solution judging unit for determining whether or not a solution of said execution times of said actions of said transfer device is obtained by said schedule calculator; and a retrying unit for, when it is determined by said solution judging unit that a solution of said execution times is not obtained, correcting said conditional formula so as to reduce the average number of substrates which are simultaneously present in the apparatus, and retrying calculating said execution times by said schedule calculator.

18. The substrate processing apparatus according to claim 15 characterized by further comprising:

a schedule judging unit for determining whether or not it is necessary to newly calculate execution times of actions of said transfer device by said schedule calculator after the apparatus has started to operate; and a calculating condition determiner for, when it is determined by said schedule judging unit that it is necessary to newly calculate execution times of actions of said transfer device, determining an assumed time serving as a stating point of calculation of new execution times and a final substrate to be processed in calculating said execution times by said schedule calculator;

wherein said schedule calculator calculates new execution times of actions for substrates up to said final substrate determined by said calculating condition determiner while holding the result of a past scheduling process prior to said assumed time determined by said calculating condition determiner.

19. The substrate processing apparatus according to claim 15 characterized by further comprising:

an actual time acquisition unit for acquiring times when said transfer device starts said actions thereof;

a rescheduling judging unit for determining whether or not said times acquired by said actual time acquisition unit and the execution times in the result of the past scheduling process are inconsistent with each other or differ from each other by at least a predetermined range; and a corrector for, when it is determined by said rescheduling judging unit that said acquired times and the execution times in the result of the past scheduling process are inconsistent with each other or differ from each other by at least said predetermined range, correcting said execution times of said actions of said transfer device which are not performed at that time.

20. The substrate processing apparatus according to claim 15 characterized by further comprising:

a condition change detector for detecting a change in conditions with respect to a substrate expected to be introduced into the apparatus after the apparatus has started to operate; and a corrector for, when a change in conditions with respect to said substrate is detected by said condition change detector, correcting said execution times of said actions of said transfer device on the substrate for which a condition is changed and substrates subsequent to said substrate for which a condition is changed.

21. The substrate processing apparatus according to claim 15 characterized in that when the process of at least one processing device in the apparatus with respect to at least one substrate is omitted, said schedule calculator calculates said execution times of said actions of said transfer device so as to transfer said at least one substrate to skip said at least one processing device.

* * * * *

UNITED STATES PATENT AND TRADEMARK OFFICE
CERTIFICATE OF CORRECTION

PATENT NO.     : 6,772,029 B2
DATED          : August 3, 2004
INVENTOR(S)    : Yoichi Kobayashi et al.

It is certified that error appears in the above-identified patent and that said Letters Patent is hereby corrected as shown below:

Title page, Item [54] and Column 1, lines 1-3,
Title, change "WAFER TRANSFER CONTROL APPARATUS AND METHOD FOR TRANSFERRING WAFER" to -- SUBSTRATE TRANSFER CONTROLLING APPARATUS AND SUBSTRATE TRANSFERRING METHOD --.

Column 28,
Line 8, change "The" to -- A --.

Signed and Sealed this

Sixteenth Day of November, 2004

JON W. DUDAS
*Director of the United States Patent and Trademark Office*